United States Patent
Guha et al.

(10) Patent No.: US 9,972,478 B2
(45) Date of Patent: May 15, 2018

(54) METHOD AND PROCESS OF IMPLEMENTING MACHINE LEARNING IN COMPLEX MULTIVARIATE WAFER PROCESSING EQUIPMENT

(71) Applicant: Lam Research Corporation, Fremont, CA (US)

(72) Inventors: Joydeep Guha, Danville, CA (US);
John Daugherty, Fremont, CA (US);
Vahid Vahedi, Oakland, CA (US);
Richard Alan Gottscho, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/268,472

(22) Filed: Sep. 16, 2016

(65) Prior Publication Data

US 2018/0082826 A1 Mar. 22, 2018

(51) Int. Cl.
*G01L 21/30* (2006.01)
*H01J 37/32* (2006.01)
(Continued)

(52) U.S. Cl.
CPC .. *H01J 37/32935* (2013.01); *H01J 37/32082* (2013.01); *H01J 37/32926* (2013.01);
(Continued)

(58) Field of Classification Search
CPC . H01L 22/20; H01L 21/306; H01L 21/67253; H01L 21/3065; H01J 37/32009;
(Continued)

(56) References Cited

U.S. PATENT DOCUMENTS

| 2003/0201162 A1 | 10/2003 | Liu et al. ................ 204/192.13 |
| 2005/0220984 A1 | 10/2005 | Sun et al. ........................ 427/8 |

(Continued)

OTHER PUBLICATIONS

PCT International Search Report, PCT/US17/48965, PCT/ISA/210, dated Nov. 16, 2017.

*Primary Examiner* — Lan Vinh
(74) *Attorney, Agent, or Firm* — Martine Penilla Group, LLP

(57) ABSTRACT

Methods and systems for controlling processing state of a plasma reactor to initiate processing of production substrates and/or to determine a ready state of a reactor after the reactor has been cleaned and needs to be seasoned for subsequent production wafer processing are provided. The method initiate processing of a substrate in the plasma reactor using settings for tuning knobs of the plasma reactor that are approximated to achieve desired processing state values. A plurality of data streams are received from the plasma reactor during the processing of the substrate. The plurality of data streams are used to identify current processing state values. The method includes generating a compensation vector that identifies differences between the current processing state values and the desired processing state values. The generation of the compensation vector uses machine learning to improve and refile the identification and amount of compensation needed, as identified in the compensation vector. The method further includes transforming the compensation vector into adjustments to the settings for the tuning knobs and then applying the adjustment to the tuning knobs of the plasma reactor.

14 Claims, 11 Drawing Sheets

(51) Int. Cl.
*H01L 21/67* (2006.01)
*H01L 21/3065* (2006.01)
(52) U.S. Cl.
CPC .... *H01L 21/3065* (2013.01); *H01L 21/67069* (2013.01); *H01L 21/67242* (2013.01); *H01L 21/67248* (2013.01); *H01L 21/67253* (2013.01); *B81C 2201/0138* (2013.01); *H01J 2237/334* (2013.01)
(58) Field of Classification Search
CPC ....... H01J 37/32027; B81C 2201/0138; B81C 99/0065
USPC ............ 156/345.23, 345.24, 345.25, 345.26, 156/345.28, 345.35; 216/59; 438/714
See application file for complete search history.

(56) References Cited

U.S. PATENT DOCUMENTS

| | | | |
|---|---|---|---|
| 2009/0284156 A1* | 11/2009 | Banna | H01J 37/321 315/111.21 |
| 2010/0063787 A1 | 3/2010 | Brcka | 703/6 |
| 2013/0157387 A1* | 6/2013 | Chen | H01J 37/32963 438/5 |
| 2015/0083690 A1 | 3/2015 | Chen et al. | 216/67 |
| 2015/0200075 A1 | 7/2015 | Godyak | H01J 7/3211 |
| 2016/0148850 A1* | 5/2016 | David | H01L 22/20 438/5 |

* cited by examiner

METHOD AND PROCESS OF IMPLEMENTING MACHINE LEARNING IN COMPLEX MULTIVARIATE WAFER PROCESSING EQUIPMENT

FIELD OF THE INVENTION

The present embodiments relate to methods and computer implemented processes for characterizing processing states that are desired during processing in a plasma reactor and using data streams collected during plasma processing to make adjustments to processing parameters so that a current processing state best matches a desired processing state. In some implementations, the adjustments made are adjustments to physical settings, e.g., knobs that control parameter settings of the plasma reactor, and such settings are configured to shift the processing toward a known desired processing state. Furthermore, in the various disclosed embodiments, disclosure is provided regarding ways of optimizing the processing of data streams collected from sensors of the plasma reactor, and processing the data streams to make adjustments based on machine learning algorithms.

BACKGROUND

Plasma has long been employed to process substrates (e.g., wafers or flat panels) to form electronic products (e.g., integrated circuits or flat panel displays). Semiconductor wafers are typically placed in an etch chamber with a mask layer to direct the etch of underlying materials. The etching process removes the underlying materials not covered by the mask. Due to the volatile plasma conditions generated inside of a chamber, the etch process may also remove material from surfaces of parts within the plasma chamber. Over time, the parts inside the processing chamber will therefore wear and will accumulate particulate matter and/or etch residues, which may alter the etch performance and/or cause process drift. For this reason, in addition to the need to replace consumable parts, there is also a need to periodically perform wet clean operations (i.e., of the inside surfaces and/or parts of a chamber).

After a wet clean, the chamber must be reconditioned through various steps/processes (i.e., processed for wet clean recovery) before the chamber is allowed to proceed with production wafer processing. This process is sometimes referred to as chamber "seasoning." Seasoning attempts to produce surface conditions that mimic a steady state. When steady state is achieved, the solution tends to be brittle, i.e. it is not always universal from process to process or chamber to chamber. Perhaps even worse, the seasoning itself can be a significant fraction of the total tool utilization, e.g. seasoning for 15-70 hours while the process only runs for 150-250 hours. Obviously, this is a productivity hit, not to mention wasted energy consumption, cost of seasoning wafers, and high cost of consumables as they wear just to season them. Furthermore, while a chamber recovers from a wet clean, fabrication of production wafers is stopped.

As is well known, etch and deposition reactors are very complex equipment with multiple variables to control correct wafer processing condition. In modern semiconductor processing, the system has grown so complex that it is non-trivial to explain different physical/chemical processes using set of trivial physical equations. Due to this complexity, it is difficult to model modern day etch/deposition processes in its full form with all gas/pressure/power/frequency inputs. This difficulty in modeling (and by extension predicting) has reduced plasma processing into an art which largely depends on the artist's experience level (in this case the engineer) and environment rather than a predictable science.

It is in this context that embodiments arise.

SUMMARY

Methods and systems for controlling processing state of a plasma reactor to initiate processing of production substrates and/or to determine a ready state of a reactor after the reactor has been cleaned and needs to be seasoned for subsequent production wafer processing, are disclosed. The method initiates processing of a substrate in the plasma reactor using settings for tuning knobs of the plasma reactor that are approximated to achieve desired processing state values. A plurality of data streams are received from the plasma reactor during the processing of the substrate. The plurality of data streams are used to identify current processing state values. The method includes generating a compensation vector that identifies differences between the current processing state values and the desired processing state values. The generation of the compensation vector uses machine learning to improve and refile the identification and amount of compensation needed, as identified in the compensation vector. The method further includes transforming the compensation vector into adjustments to the settings for the tuning knobs and then applying the adjustment to the tuning knobs of the plasma reactor.

In some embodiments, a method further includes continuing to receive the plurality of data streams from the plasma reactor during the processing of the substrate to produce the adjustments to the settings of the tuning knobs to assist in moving the current processing state values toward the desired processing state values.

In some embodiments, the desired processing state and the current processing state are defined in a virtual space that is descriptive of a physical state of plasma conditions sensed within a processing volume of the plasma reactor by the sensors. By way of example, and without limitation to others, the plasma conditions can be a set of detected ion, electron and neutral fluxes at a plane of the substrate, for a specific reactor wall surface condition.

In some embodiments, the compensation vector identifies the differences between the desired processing state values and the desired processing state values in the virtual space. And, the transformation of the compensation vector identifies the adjustments to the settings for the knobs as a set of identified physical knobs having an identified physical adjustment. In one embodiment, a controller of the plasma reactor is configured to process program instructions that cause the adjustments of the settings to the knobs.

In some embodiments, a multivariate process is configured to identify the differences between the current processing state values and the desired processing state values. The multivariate process includes processing machine learning to make adjustments to the desired processing state values to produce adjusted desired processing state values based, at least in part, on verification feedback received from one or both of etch rate performance or monitor wafer performance of the processing of the substrate.

In some embodiments, the processing of the substrate is identified for a specific plasma reactor and a specific process recipe, and each specific process recipe and each specific plasma reactor has an associated model that includes settings for tuning knobs and desired processing state values. In one configuration, the model is accessed from a model database.

In some embodiments, as a model from the model database is used, a machine learning process makes adjustments to the settings for the tuning knobs of the model to improve settings to the specific plasma reactor to achieve the desired processing state values. This causes the models in the model database to be refined and improved over time.

In some embodiments, the method includes updating the models in the model database based on the adjustments made by the machine learning.

In some embodiments, the machine learning uses as input sensitivity data for the sensors of the plasma reactor, such that the produced compensation vector includes adjustments that are moderated based on sensitivity data.

In another embodiment, a system for controlling processing state of a plasma process of a reactor is disclosed. The plasma reactor has a plurality of tuning knobs for making settings to operational conditions of the plasma reactor. A plurality of sensors of the plasma reactor is included, and each of the plurality of sensors is configured to produce a data stream of information during operation of the plasma reactor for carrying out the plasma process. A controller of the plasma reactor is configured to execute a multivariate processing that is configured to use as input desired processing state values that define intended measurable conditions within a processing environment of the plasma reactor and identify current plasma processing values. The multivariate processing uses a machine learning engine that receives the desired processing state values, receives data streams from the plurality of sensors during processing of the plasma process, receives sensitivity data regarding sensor signals to compensation of tuning knobs, and receives reactor wall surface dynamics for use by a phenomenological model that defines plasma dynamics within the processing environment in terms of said data streams produced by said plurality of sensors of the plasma reactor.

The machine learning engine is configured to identify current processing state values used to produce a compensation vector. The compensation vector defines differences between the desired process state values and the current processing state values. The controller is further configured to execute compensation processing that transforms the compensation vector expressed in terms of measured conditions within the processing environment to changes of specific one or more of the tuning knobs of the plasma reactor. The controller is configured to instruct regarding changes to the tuning knobs of the plasma reactor to cause a change in the measurable conditions of the processing environment of the reactor.

In some embodiments, the machine learning engine is configured to periodically receive measured substrate performance data regarding one or both of etch rate measurements or monitor wafer measurements. The measured substrate performance data is used to make adjustments to the desired processing state values, which in turn cause adjustments to the compensation vector and the resulting changes to said one or more of the tuning knobs.

In some embodiments, the machine learning engine is configured to perform verification of the current processing state values with real data obtained from one or both of etch rate measurements or monitor wafer measurements.

In some embodiments, the system executes a plasma reactor seasoning phase that uses non-production substrates. The plasma reactor seasoning phase is monitored by the controller by executing the multivariate processing to identify when the current processing state values are within a bound that enables adjustment of the tuning knobs to place the plasma reactor in a state that is ready for processing production substrates and enables discontinuing of the plasma reactor seasoning phase.

In some embodiments, the system executes a production phase that uses production substrates. The controller executes the multivariate processing to identify when the current processing state values are within a bound that enables adjustment of the tuning knobs to compensate for drift in the plasma process. The compensation for drift occurring multiple times during said production phase, and the adjustments in the tuning knobs are calculated to move the processing environment closer to the desired processing state values as measured by the plurality of sensors.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Figure 1:
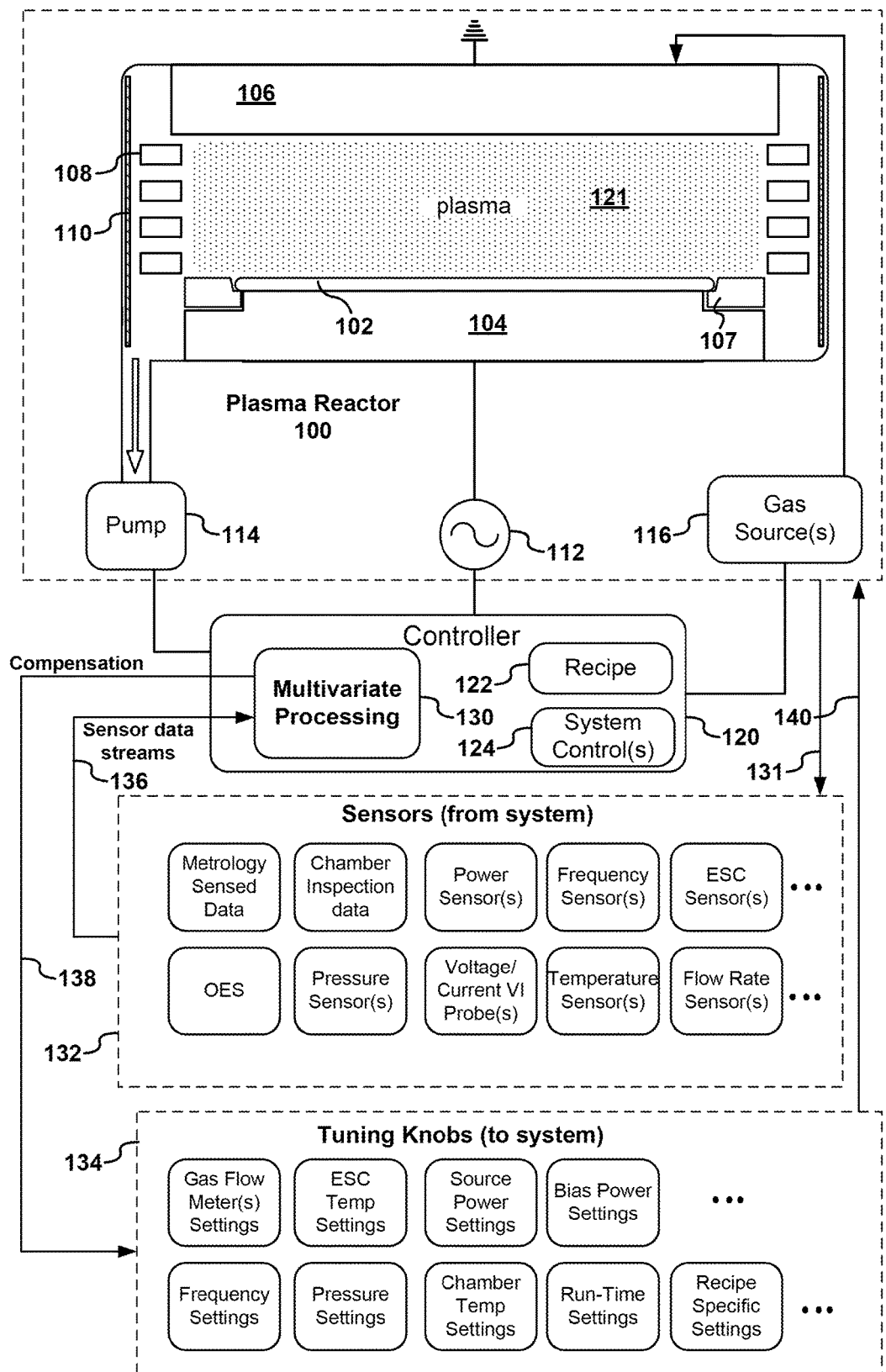
FIG. 1 illustrates an example plasma reactor, which may be used in conjunction with a controller, to process substrates.

The following embodiments describe methods, devices, systems, and computer programs for monitoring plasma processing systems, and in particular, plasma processing tools used to process semiconductor substrates, e.g., wafers.

In one embodiment, methods and systems are provided to address the complexity of tuning plasma reactors during processing to achieve desired processing performance and maintain this performance over time as the plasma reactor experiences physical changes, e.g., due to particle and/or material buildup on surfaces and chamber walls, and consumption or wear of plasma exposed chamber consumable parts. Further, there is a need for methods and systems to enable monitoring chamber conditions during post-clean operations, e.g., wet cleans, to enable identification of when chambers are exhibiting characteristics that confirm completion of seasoning processes.

In one embodiment, the complexity associated with such monitoring of processing state, identifying when seasoning processes are complete, and adjustment for process drift during production processing is overcome by implementation of data analytics. The data analytics uses data streams from different sensors present (or new sensors incorporated) in a plasma reactor. Data is then analyzed to provide substantial real-time information about a plasma reactor's processing environment. Through this information it is possible to define deviations from an ideal behavior and henceforth derive a set of compensation values that can be applied to tuning knobs of the plasma reactor to correct for that deviation.

In one embodiment, in addition to comparing current processing states to desired processing states for a plasma process type and a plasma reactor type, a machine learning engine is configured to learn from past processing, which produces adjustments and refinements to the desired processing state values. In one embodiment, the machine learning engine operates a mathematical model that is refined over time and is able to learn and correct not only the desired processing state values but also the compensation variables and its magnitude which upon translation into physical variables can be used as tuning knobs to physical controls, values, settings of a plasma reactor.

In one embodiment, aspects of the disclosed embodiments define what a process engineer wants the processing state of the plasma to be when a production wafer is introduced into the plasma reactor. Broadly speaking, the processing state is the desired processing state, which are measurable conditions within a processing environment of the plasma reactor. The conditions are, for example, measured by a plurality of sensors of the plasma reactor, which during processing, produce data streams. Each data stream, for example, can provide values read for a particular condition over time, and the changes in the values represent changes in said condition.

In one embodiment, the desired processing state values of the reactor define the desired state of operation for the plasma reactor when a wafer is to be introduced. For example, if the plasma reactor has just undergone a wet clean, the plasma reactor is put through a seasoning phase where seasoning wafers are processed until the plasma reactor reaches the desired processing state, or in one embodiment, when the plasma reactor tuning knobs are adjusted to shift the current processing to the desired processing state. In one embodiment, processing state is defined as one or a combination of ions, radicals, electrons and neutral fluxes at a wafer plane with given wall boundary conditions. These conditions, in one embodiment, are detected by sensors of the plasma reactor.

Processing state can be defined as a spatial variable, but in one embodiment it can be defined at an arbitrary point in the plasma reactor. Correlating processing state at this arbitrary point to on-wafer results (e.g., during process verification) eliminates the need to deal with spatial dependence of processing state inside the plasma reactor. By way of example, spatial variation in processing state can be dealt with sensor data from different spatial positions inside the reactor. It is believed that information on "etching state" of the reactor (if the process is an etch plasma process), is contained in data streams from its sensors. Any particular data stream might not have all the information but mathematical combination of different data streams can identify the "processing state" of the plasma reactor.

This is a unique way of identifying "processing state" defined in terms of a mathematical model of sensor output from the plasma reactor. In one embodiment, the "processing state" of the reactor can be described in a mathematical framework, thereby applying it to any reactor with sensors output characterizing reactor's basic features.

Once a "processing state" of the plasma reactor is defined in terms of its sensor outputs, it is possible to continuously monitor the etching state in real time and compare it with a desired "processing state". Comparison between current and desired "processing state" will generate a "compensation vector" which can be transformed into reactor level variables (i.e., knob ID and amount of change to said knob) through a suitable mathematical transformation. Reactor level variables, in this example, are therefore the tuning knobs on the plasma reactor, e.g., gas flows, pressure, temperature, etc. Through compensation vectors, the tuning knobs on the reactor can be compensated to achieve the values for the desired "processing state" in the plasma reactor.

In one embodiment, data streams from a reactor are used in a whole new perspective and thereby make them useful for the purpose of chamber control through the use of machine learning. FIGS. 1-12 below will provide examples of how information may flow to enable machine learning in the context of plasma reactors. Broadly speaking, the machine learning will enable efficient process calibration to set-up plasma reactors after wet clean operations, enable efficient identification of when a plasma reactor has completed its seasoning operation, and dynamic use of machine learning to correct for process drift during production wafer processing.

It will be apparent, that the present embodiments may be practiced without some or all of these specific details. In other instances, well-known process operations have not been described in detail in order not to unnecessarily obscure the present embodiments.

FIG. 1 illustrates an example plasma reactor 100, which may be used in conjunction with a controller 120, to process substrates 102. The substrates may be, for example, semiconductor wafers, flat panel displays, or any other type of substrate that can be or may be processed using a plasma process. The controller 120, is configured to execute multivariate processing 130, which implements machine learning in order to dynamically adjust the processing state of the reactor 100, based on a desired processing state. It should be understood that the plasma reactor 100 is only one type of reactor that can benefit from the multivariate processing 130 that can be executed by a controller 120 or a processing computer interfaced with the controller 120.

As shown, the plasma reactor 100 is a capacitively coupled plasma (CCP) etching chamber, which uses an RF (radio frequency) source 112 to power a bottom electrode 104. The top electrode 106 is coupled to ground, and confinement rings 108 are used to maintain plasma 121 in a processing region over the surface of the substrate 102. This chamber also includes a liner 110, which protects the chamber wall surfaces from plasma particulate buildup, and allows for efficient cleaning. A focus ring 107 is shown surrounding the substrate 102 and the bottom electrode 104. Source gases 116 are, in one embodiment, delivered into the plasma reactor 100 through a showerhead disposed in or adjacent to the top electrode 106. One or more pumps 114 are used to adjust the pressure within the plasma reactor 100, processing gases during operation.

The CCP etching chamber is therefore only one example of a plasma reactor 100, which can benefit from utilizing multivariate processing 130 to achieve efficient compensation of tuning knobs so that desired processing states are achieved and/or maintained. Without limitation, other types of plasma chambers can include deposition chambers that utilize different types of deposition processes, other types of etching chambers, such as inductively coupled plasma (ICP) etching chambers, and the like. Anyone of these chambers may be controlled by a controller 120 or a computer, so as to adjust system controls 124 of the plasma reactor 100. The system controls 124, in one embodiment, represent controls provided to one or more tuning knobs 134. The plasma reactor 100 may also be associated with a plurality of sensors 132. In some embodiments, the sensors will vary depending on the structure of the plasma reactor 100, or additional sensors may be added to the plasma reactor 100 to capture specific types of data from the plasma 121 during processing.

As shown, the sensors 132 may include one or more of an optical emission spectrometry (OES) sensor, a pressure sensor, a voltage sensor, a current sensor, a temperature sensor, a flow rate sensor, frequency sensor, a power sensor, a metrology sensor, and combinations of two or more thereof. As an example, the following table A illustrates example information that can be obtained from various sensors of a plasma reactor.

TABLE A

| Data Stream | Containing Information |
| --- | --- |
| OES | Plasma Species |
| | Plasma Density |
| | Gas Temperature |
| | Gas Density |
| Pressure | Gas Density |
| | Gas Temperature |
| VAT Valve | Change in position indicates Number density change |
| | Gas Temperature |
| Confinement Ring position | Change in position indicates Number density change |
| | Gas Temperature |
| Match Capacitor Position | Plasma Impedance change |
| | Could be correlated with OES to infer plasma Chemistry change |
| Impedance Magnitude/Phase | Contains Information on chamber state |
| Heater Duty Cycle to maintain S.P | Gas heating or Density change |
| | Can be correlated to with OES or Electrical signals |
| Power required to maintain fixed Voltage | Change in Plasma Density |
| Forward and Reflected Power | Loss of Deposited Power |
| | Could be correlated with OES and Electrical signals to indicate shift |
| Harmonics in Frequency | Indication of shift in Plasma state |

It should be noted that different types of plasma reactors will have different types of sensors, and it is possible to add additional sensors beyond those listed herein, which are only provided by way of examples. Furthermore, it should be understood that this information need not deal with absolute values. Thus, delta changes are of interest in the multivariate processing that uses said machine learning. Consequently, even small amplitude changes may be statistically evaluated.

Also shown is example tuning knobs 134, which additionally can be varied depending on the type of plasma reactor. Example types of tuning knobs can include one or more of controls to adjust gas flow meters (e.g., MFCs), controls to adjust power settings, controls to adjust temperature settings, controls to adjust physical gap separations between top and bottom electrodes of the plasma reactor, controls for adjusting an electrostatic chuck (ESC) temperature or operation, controls for adjusting bias power settings, controls for setting chamber pressures, controls for setting frequencies of one or more radio frequency generators, controls for setting run time of specific recipe operations, controls for setting pumping rates of vacuum, controls for setting duration of gas flows, controls for gas partial pressure in a recipe, controls for setting monitoring algorithms, controls triggering borescope inspections, controls for setting or determining intervals between clean operations, or combinations of two or more thereof. As noted, different types of plasma reactors will have different types of tuning knobs, and it is possible to add additional tuning knobs beyond those listed herein.

In one embodiment, the controller 120 may execute the multivariate processing 130 in order to place the plasma reactor 100 into production service. This operation may be required after a chamber cleaning operation, wherein the chamber is opened to atmosphere and thoroughly cleaned and/or parts removed and replaced. Sometimes, this type of cleaning is referred to as wet cleaning, since the plasma reactor is opened and subjected to various types of cleaning and or conditioning operations. The requirement to clean the chamber periodically during service is necessitated because plasma processing by its very nature will produce particulates and byproducts that may be adhered to the surfaces of the interior regions of the reactor, and the surfaces must be cleaned in an effort to prevent excessive process drift.

If excessive process drift occurs, the performance of an etch operation (or deposition operation) will vary, and may not produce the same results that are required for a specific process. Before the drift has changed the process results to levels that are not acceptable, chambers are typically programmatically shut down and required to undergo a wet clean. After the wet clean is performed, the chamber needs to go through a seasoning operation. The seasoning operation utilizes substrates that are configured to approximate the type of process being performed with production wafers. During the seasoning operation, etch processes are performed (or deposition processes), and this very process will cause particulates and material to adhere to the surfaces within the process chamber.

Without utilizing the multivariate processing 130 described herein, typical processing would require operators to simply run seasoning operations for several hours. Because it was not possible to accurately determine when the chamber was adequately seasoned, common practice has been to simply run the seasoning operation for more hours than would possibly be needed. Of course, this introduces substantial delay in making the plasma reactor available for processing production wafers. In accordance with one embodiment, the multivariate processing 130 is configured to utilize machine learning to compare desired processing state values detected from data streams captured by sensors of the plasma reactor, and utilize machine learning to determine what adjustments are required to the specific tuning knobs so that the current processing state values match or closely approximate the desired processing state values.

This process can be performed after a wet clean operation, which can identify when the chamber is ready to be placed into production, without wasting excessive time running seasoning wafers, when the wafer is indeed already ready for production use. When the plasma reactor is placed into production, specific recipes 122 can be set, so as to define the starting parameters of the plasma processing. The starting parameters can identify initial settings for the tuning knobs 134, and other parameters associated with placing the plasma reactor in a condition for receiving a production wafer. Initially, the processing state of the plasma reactor can be identified from a model database, where a model includes desired processing state values and tuning knob settings. The model database, in one embodiment, may be constructed initially by experimental learning processing, which utilizes test substrates in order to create an initial model that is placed into the model database.

As the process is run in production, the production processing will produce updates, utilizing the multivariate processing, which update and refine the model for the process. Therefore, as the process is run more times, the values of the desired processing state and the corresponding tuning knobs are also refined and updated. This produces a type of continuous learning feedback, which over time improves the performance of the system. Thus, sensor data from the sensors 132, as received from sensors of the plasma reactor 131 will be producing sensor data streams 136, which are fed to the multivariate processing 130. If the multivariate processing 130 determines that an adjustment is needed to the settings of the specific one or more tuning knobs 134, compensation 138 is propagated to the actual tuning knobs, to effectuate a change 140 in the processing. This feedback operation ensures that the plasma processing environment in the plasma reactor 100 is achieving the desired processing state even when the conditions within the plasma reactor are changing (e.g. particulate and/or material buildup on the walls and/or consumable part where is occurring).

Figure 2:
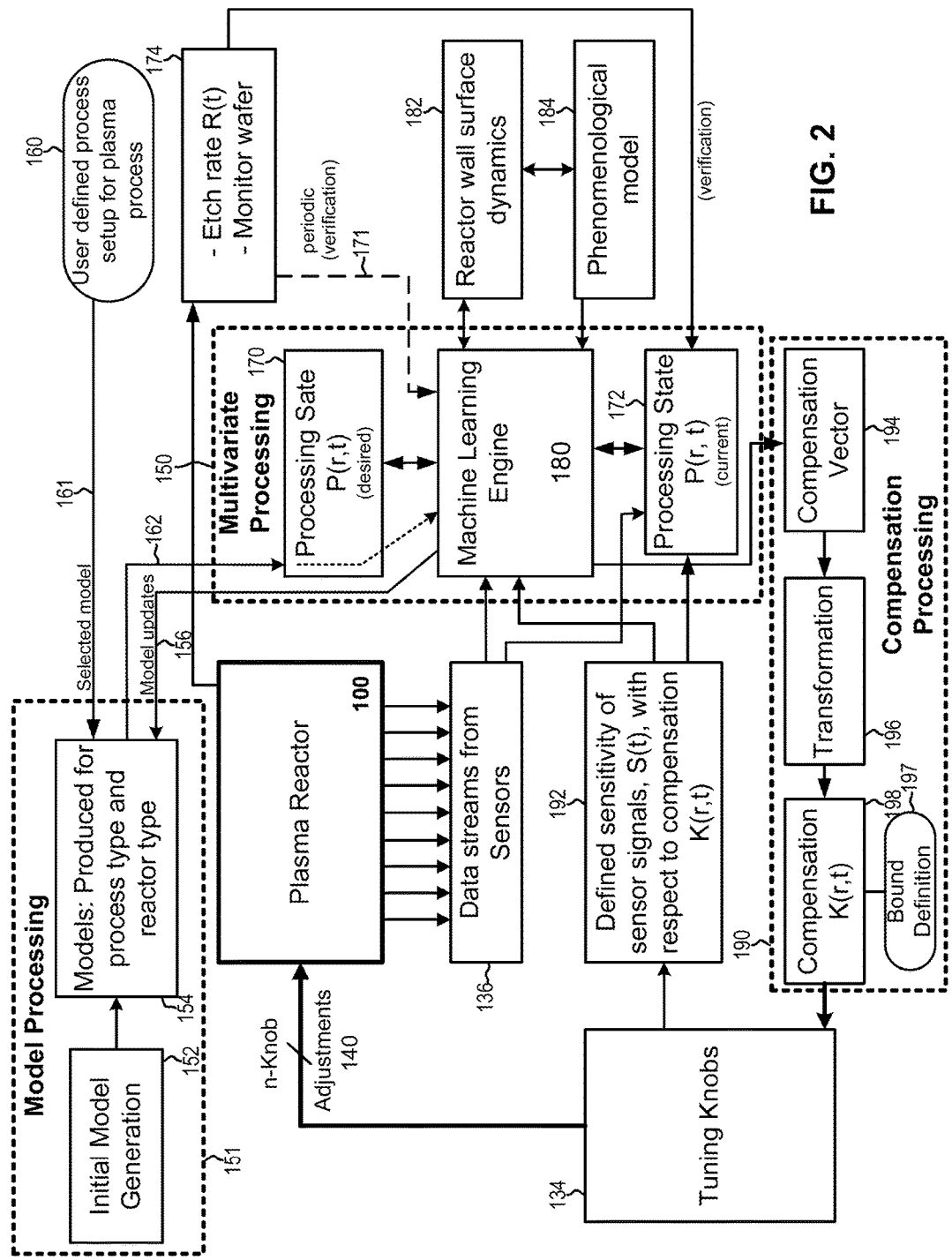
FIG. 2 illustrates a general framework for utilizing multivariate processing to monitor and provide dynamic feedback to tuning knobs during processing of a reactor, in accordance with one embodiment.

FIG. 2 illustrates a general framework for utilizing multivariate processing 150 to monitor and provide dynamic feedback to tuning knobs 134 during processing of a reactor 100, in accordance with one embodiment. The multivariate processing 150, in one embodiment, utilizes machine learning engine 180, which functions to take inputs from various data producing modules in order to determine the degree of compensation needed based on changing conditions within the plasma reactor 100.

The compensation is provided in the form of adjustments to tuning knobs 134, which modify the conditions of the plasma reactor 100, which therefore are calculated to produce a current processing state that more closely approximates the desired processing state for a specific process type being run in the plasma reactor 100. Broadly speaking, the process type shall refer to a type of processing operation to be performed in the plasma reactor 100. The process type can be defined in terms of a specific type of etching operation and its specific chemistries and parameters associated with a recipe. Similarly, the process type can be defined for a specific deposition operation to be executed by the plasma reactor 100. In the following discussion, reference is made to etching operations, but it should be understood that the operations can equally be utilized for deposition operations.

As illustrated, model processing 151 is an operation that may be performed to generate models that characterize a process for a plasma reactor, in accordance with one embodiment. Initial model generation 152 may be performed when a type of reactor or process has not been previously run, and a process engineer needs to qualify the specific process for a specific plasma reactor. These operations can be performed by experimental testing of test wafers in the plasma reactor when exposed to specific processing conditions and associated tuning knob settings. Once the process has been validated by a process engineer during this experimental testing, a model is generated in operation 154.

The model will include an identification of the process type and the reactor type. The model, as described in more detail below, may include information that identifies the desired processing state as well as the tuning knob settings for the specific process. By way of example, the processing state values will be identified in terms of their detectable characteristics, e.g. by sensors of the plasma reactor. This characterization of plasma state values is, in one embodiment, referred to as virtual space characteristics, because the values are not specific settings but instead are detectable values that can be identified from data streams collected from sensors of the plasma reactor. As will be described below, these virtual space characteristics can be transformed into real tuning knob identifiers and tuning knob magnitudes, which define which specific tuning knob will be adjusted or changed and the specific amount to change or adjust the tuning knob or knobs.

Accordingly, the process can begin by a user (process engineer or technician) identifying a process set up for a plasma process in operation 160, which acts to select a model 161 from a model database. The model, which includes the desired processing state values and initial tuning knob settings are communicated to the multivariate processing 150 via 162. This defines the initial starting point of the process, which identifies the specific processing state values that are desired. Data streams 136 from sensors of the plasma reactor 100 are provided to the machine learning engine 180 of the multivariate processing 150.

In addition, the machine learning engine 180 is utilizing the desired processing state values 170 in order to determine when based on the data streams provided by the sensors, the current processing state values 172 are not matching the desired processing state values 170. In addition, the machine learning engine 180 will be receiving periodic information from etch rate analysis, which may be performed after one or more substrates are tested using a metrology tool. Similar processes can be performed with a monitor wafer, which is configured to approximate the type of processing desired to be executed by the plasma reactor 100. In either operation, etch performance verification 174 can be performed and provided as periodic data 171 to the machine learning engine 180.

This allows the machine learning engine 180 to determine when the desired processing state values 170 should be adjusted, as the true performance of the plasma reactor 100 is no longer matching the original desired processing state 170. As such, the machine learning engine 180 may be dynamically adjusting the desired processing state 170 based on its periodic validation operations, e.g., utilizing off-line metrology test data that is fed back to the machine learning engine 180. Additionally, machine learning engine 180 may be provided with information regarding reactor wall surface dynamics 182. This information may include data regarding the inferred characteristics of the chamber wall surfaces, as they change during processing. By way of example, this data can be inferred from historical measurements of wall characteristics, e.g., material buildup, flaking, roughness, consumable part usage, and other physical characteristics. This data can be inferred, as it may be provided by a model that predicts the type of physical changes that will occur on the reactor wall surfaces during operations over time. In some embodiments, this data can be dynamically updated from time to time and refined based on inspection of the reactor wall surfaces, e.g. when a chamber enters a wet clean cycle.

As an optional refinement input to the machine learning engine 180 input from a phenomenological model 184 is used, that approximates the behavior of the plasma within the chamber, given the reactor wall surface dynamics 182. The phenomenological model 184, in one embodiment, is used to approximate the nature of the chemical reactions that are occurring within the processing volume, and associated interactions with the reactor wall surfaces. Broadly speaking, a phenomenological model is sometimes referred to as a statistical model, as it is a mathematical expression that relates several different empirical observations of phenomena to each other. This relation is consistent with fundamental theory, but is not directly derived from theory. Thus, a phenomenological model does not attempt to explain why the variables in the plasma (i.e., when chemical bonds break to define different chemical species or when the recombine to define a different chemical form upon coming into contact with a surface in the reactor, e.g., a chamber wall). Generally, the phenomenological model 184 is configured to characterize the anticipated chemical kinetics of gases in the plasma of the plasma reactor, and their behavior relative to the reactor wall surface dynamics 182. These kinetics may include, for example, electron collision reactions, wall recombination reactions, wall loss reactions, etc., for different chemistries. Thus, this model simply attempts to describe the relationship, with the assumption that the relationship extends past the measured values. The phenomenological model 184 is configured to produce input to the machine learning engine 180 that is in terms of sensor output. That is, the characterization of the plasma behavior by the phenomenological model 184 is configured to produce input data to the machine learning engine 180 in the form of information similar to that which can be captured by a sensor coupled to the plasma reactor 100.

By way of example, the data produced by the phenomenological model 184 may be characterized in the form of any one of the outputs produced by the sensors 132, as described with reference to FIG. 1. Taking an example of measurements of optical emission spectroscopy (OES) spectra by a sensor, e.g., an OES sensor, the output could be produced in the form of intensity (I). The phenomenological model 184 may approximate the changes to the reactor wall surfaces and the anticipated plasma characteristics in the form of intensity (I). Thus, since the machine learning engine 180 may already be receiving output from an OES sensor (e.g., in the form of a data stream), the machine learning engine 180 is programmed to anticipate inputs associated with intensity. The phenomenological model 184 therefore is configured to generate input to the machine learning engine 180 and the same form of intensity. Thus, the intensity (I) may be represented as a function of surface roughness of the anodized chamber walls, plasma density, gas flows, etc.

Thus, it can be said that the phenomenological model 184 provides input to the machine learning engine 180 in the form of or in terms of sensor output data. The example provided above with respect to OES sensor data is just one example, in the same type of modeling that can be provided for other types of sensor data, such as sensors associated with capacitance, voltage, current, or other measurement characteristics produced by actual sensors that are coupled to the plasma reactor 100.

Machine learning engine 180 is also configured to receive as input data that defines sensitivity of sensor signals 192 with respect to compensation values for specific tuning knobs. The sensitivity information can be obtained from experimental testing of a plasma reactor, wherein specific conditions of the reactor are modified and the sensitivity can be quantified. The sensitivity, for example, relates to specific tuning knobs that can be modified and changed for the plasma reactor 100, and the resulting sensitivity associated with changes to the settings of the knobs.

For example, changing a specific value setting on a particular knob may have more dramatic response to etch rate (ER) than changing another value setting on another particular knob. As a further example, plasma reactors can be categorized or associated with predefined sensitivity profiles for specific knobs, and the identification of the sensitivity values for each of the specific tuning knobs can be experimentally determined. For instance, in some cases the sensitivity slope for etch rate as pressure is increased can have a slope of about 2%, while an adjustment to source power can have a slope of about 8%. In some embodiments, the etch rate will vary based on temperature in accordance calculated distribution function, which may increase as the temperature goes up and then decrease at a certain point. In addition to etch rate, which is only one parameter that characterizes the sensitivity of changes made by specific tuning knobs, other types of metrics that can be characterized include, for example, changes to OES measurements in response to specific changes in pressure, source power, gas flows, electrode separation positions, etc.

Still further, other measurable parameters that can be affected by changes in specific tuning knobs can include, for example, changes in capacitance position between electrodes, changes flow rates, and other measurable parameters that can be captured by sensors associated with the plasma reactor 100. Thus, for every sensor output, the sensitivity characterization can be performed in order to determine how each specific change to a different tuning knob will affect the resulting measurements detected by the specific sensors, and associated sensitivities. In one embodiment, it is possible to perform sensitivity testing on a chamber by varying one or more tuning knobs at a time, and then measuring a plurality of outputs from the various sensors. This process can be repeated for any number of tuning knobs, while systematically collecting the variability for each of the measurements detected by the sensors of the system.

Accordingly, the sensitivity of etch rate associated with varying any number of specific tuning knobs must be known in order to prevent the machine learning engine 180 from generating a compensation vector 194 that prescribes too much or too little changes to specific tuning knobs.

The machine learning engine 180 is therefore configured to receive the defined sensitivity of the sensor signals 192 in operation 182 with respect to the compensation values that are to be applied to the tuning knobs 134. As mentioned above, the machine learning engine 180 is configured to produce current processing state values 172, which are compared to the desired processing state values 170 in order to identify and produce a compensation vector 194, which is processed in compensation processing 190. Compensation vector 194 is then processed through a transformation process 186 in order to produce compensation values 198. The transformation process includes converting the processing state value differences, which hold the information necessary to identify which specific tuning knobs 134 will be changed or adjusted, and the magnitude of such change or adjustment. The transformation 196, is therefore a conversion formula that converts the compensation vector values, which are in a virtual space (i.e., characterized in terms of sensor output values), to compensation values 188 that are in the real space (i.e., characterized in terms of real changes to one or more of the tuning knobs 184).

In one embodiment, the compensation values K(r,t), are associated with a bound definition 197. The bound definition 197 identifies the amount by which the compensation values should be allowed to change in the given plasma reactor 100. By way of example, if a compensation value is outside of the bound definition 197, then the system should not implement that change. That is, the bound definition 197 acts as a safety measure to prevent making changes to tuning knobs 134, which may not produce the desired result or where such change would possibly produce a process modification that is known to not be desired within the specific plasma reactor or for the process being performed on a substrate.

Still with reference to FIG. 2, data streams 136 from the plasma reactor 100 will be utilized to calculate 192 Sensitivity Coefficient $\vec{S}(t)$ with respect to change in Tuning Knobs $\vec{K}(r,t)$ where r is the position and t is time. In one embodiment, $\vec{S}(t)$ can be calculated in a regular recipe or a special recipe can be designed to calculate $\vec{S}(t)$ so that more insights can be achieved in Processing State $\vec{P}(r,t)$ of the reactor. $\vec{S}(t)_i$, where i represents number of signals, will be classified and correlated in order of relevance to represent Processing State of the reactor. For example, capacitor tuning position in a match system (i.e., coupled to an RF power source) could be correlated with Optical Emission Spectrum (OES) from the plasma and can be correlated together. In a similar way we can define different orders of correlation, with higher order defining strong correlation and lower order defining weak correlation of sensor signals.

As mentioned above, a phenomenological model 184 processing may optionally be implemented to describe plasma interactions happening at the reactor walls which control plasma properties. The phenomenological model 184 will be expressed in terms of Data Streams coming from the reactor. Thus, this data will be a lumped parameter model with some insights into physics of reactor level processing.

Input from Sensitivity Coefficient $\vec{S}(t)$, direct data Streams 136, monitor wafer and/or etch rate R(t) data 174 and phenomenological model 184 are fed to the machine learning engine 184. The machine learning engine generates a statistical model based on the inputs it receives. The statistical models are generated in real-time with input that comes into the machine learning engine 180. A statistical model is created in virtual space with all inputs that the engine receives. The desired Processing State $\vec{P}(r,t)$ values will be defined through this model. This statistical model defining $\vec{P}(r,t)$ will thus be the blue print of the reactor for a given process. A single reactor can have multiple $\vec{P}(r,t)_i$ representing different processes that can be run on the reactor, where i represents a number of processes.

Through an extension of this definition a reactor should be able to change its Processing State $\vec{P}(r,t)_i$ and machine learning engine 180 will generate compensation vectors to change from one processing state to the other. Through another extension of this definition, machine learning engine 180 will define processing state $\vec{P}(r,t)_i$ and henceforth can be utilized to do chamber matching within a fleet of chambers by defining compensation vectors for each chamber which will be unique for a given chamber. This will ensure that after application of compensation vectors to each chamber for a given process, the chamber will be in a same processing state within noise level defined. This approach of machine learning in chamber matching will reduce the cost of increasing precision and accuracy on hardware subsystems which can be a significant cost saver.

In one embodiment, through a calibrated set of experiments, the model can be taught to define processing state of the reactor. Different types of supervised machine learning models can be utilized for this purpose. This step, in some embodiments, is referred to as the learning step where the machine learning engine 180 is taught what the desired state is, what are the bounds, signal to noise, etc. Through an application of suitable algorithm the learning step can be automated.

As mentioned above, machine learning engine 180 will take all inputs from data streams 136 and will classify them in order of relevance as applicable to the model. This means that some models can have more data streams defining its entirety while other models can be described by fewer number of data streams (e.g., where each sensor produces its respective data stream).

In one embodiment, during normal operation of the reactor the machine learning engine 180 will constantly monitor data stream 136 and refine itself within bounds to be able to improve its precision in defining the desired processing state of the reactor. By way of example, the desired processing state $\vec{P}(r,t)$ will be constantly monitored during operation through machine learning engine 180 and any deviation will be captured, and machine learning engine 180 will correct for the deviation and in the process will generate compensation vectors 194. As mentioned above, compensation vectors 194 are defined in virtual space.

This means that the compensation vectors are defined in terms of measured sensor output characteristics that define the current processing state values. Compensation vectors will be accepted by machine learning if they are within bounds as defined by the user or from experience of knowing setting bounds. A transformation function will be applied in operation 196, wherein the compensation vectors are translated or converted into a tuning knob compensation vector $\vec{K}'(r,t)$ 198 that can be applied to the reactor. The compensation vector $\vec{K}'(r,t)$ can be applied to tuning knobs 134 to bring it back or maintain the desired processing State $\vec{P}(r,t)$. In one embodiment, implementation of machine learning to maintain the processing state can be done in real time, periodically on a schedule or upon user input or programmed input. In one embodiment, the processing state can be checked just before processing a wafer.

A number of machine learning algorithms may be used to process the monitored/collected data streams, and the selection of a specific algorithm may depend on a number of factors or tradeoffs. One factor to consider is the speed required to process the multivariate data and produce data used for the compensation. Another factor to consider is the accuracy of the resulting data. In light of recent significant advances in computing power, very complex multivariate data is able to be processed almost in substantial real-time. In some implementations, special purpose as well as general machines are now being used to process large amounts of data, often referred to as "big data." In some cases, cloud processing may also be used, e.g., such as cloud infrastructure providers that offer elastic compute nodes that scale based on processing demand or need. The data streams obtained from the sensors of a plasma reactor can be referred to a type of big data, and such data may be continuously and/or periodically generated during processing operations (and used to refining models). In some embodiments, data from multiple processing sessions can be collected and saved to storage, and accessed for off-line learning. Information and relationships learned from this off-line learning can also be used during real-time processing of specific recipes on specific plasma reactors.

There are several known machine learning algorithms that may be used. Without limitation, such examples may include linear/nonlinear regression, stepwise regression, decision tree learning (e.g., CART, Random Forest, Boosted Trees, etc.), association rule learning, artificial neural networks, deep learning, inductive logic programming, support vector machines (SVM), clustering, Bayesian networks, reinforcement learning, representation learning, similarity and metric learning, sparse dictionary learning, etc. It should be understood that recitation of specific machine learning algorithms should not be viewed as a restriction to any one example. As newer and more advanced algorithms are disclosed in the art of machine learning algorithms, it is envisioned that such advances can equally be used to handle processing of received plasma reactor sensor data and such data can be used to characterize models that provide insights into behavior and operation of the system. Such insights can thus be used to generate compensation data that is used to tune the plasma reactor so that the production of substrates does not stray or drift during prolonged processing of substrates.

With the above in mind, it is believed that artificial neural network algorithms of machine learning may be used to process the input data received from the data streams and the processing state values to generate compensation via tuning knobs of the plasma reactor. An artificial neural network (ANN) learning algorithm, is sometimes referred to as a "neural nets" (NN), and it is a learning algorithm that is analogized to the structure and functional aspects of biological neural networks. Computations may be structured in terms of an interconnected group of artificial neurons (e.g., nodes) and then processing information using a connectionist approach to computation. In one embodiment, a neural network usable in the context of data streams representing monitored plasma conditions may be in the form of nonlinear statistical data. These nodes are used to model complex relationships between input data streams and other inputs described with reference to FIG. 2, and the desired processing state. Patterns in the data may be found and used to produce statistical decision outcomes.

Thus, one type of machine learning includes neural network processing, which commonly uses a decision tree that is defined from nodes of the neural network. Inputs to the nodes of the neural network may be the data streams, and the different inputs to the nodes may be associated with a weight. The weight is used to determine importance of specific input connections. Further, a neural network may have a plurality of input nodes and one or more layers of node (sometimes referred to as hidden layers). The initial generation of the decision tree, in one embodiment, includes initially assigning random connection weights to the inputs to each of the nodes in the tree. The connection weights are then refined and learned using a known process referred to as backpropagation. In one embodiment, the desired processing state values represent the desired outputs of the decision tree and the input nodes receive the current processing state values. Using the random weights, output paths are calculated. These output paths that are calculated are then compared to the outputs associated with the desired processing state values.

The difference between the calculated outputs with the random weights and the outputs associated with the desired processing state values are referred to as the error in the network. Knowing this error, backpropagation is used to adjust the connection weights in an attempt to produce smaller errors. The adjusting uses a formula that is based on the old weights, the node input values, the error and a learning weight. This process of weight adjustment is repeated until all nodes are associated with updated weights. This process is used to identify which nodes are most responsible for the errors in the output, and their weights are adjusted the most. This process is continually repeated until the decision tree of nodes has been fit with weights that best define the significance or insignificance of specific nodes in the tree. During this process, specific one or more of the data streams that are causing the errors can be identified and added to the compensation vector. The compensation vector, therefore, represents the values that must change in order for the current processing state to match or best resemble the desired processing state. In some embodiments, pre-processing is required to define a model, which includes the desired processing state values. This process is described, for example, with reference to FIG. 3. The process of defining a model may, in some cases, take time to establish the desired model, and this processing can be done off-line. Once the model is generated, the model represents the starting or initial model. Over time, as the model is used in production processing, the model can continue to be refined using the machine learning. In operation, the data sets used to define the models may be saved to storage that is accessible by one or more processing machines.

In some configurations, the processing machine that executes machine learning may be the controller of the tool itself or can include one or more networked computers. Sometimes, the processing necessary to construct the models may require substantial processing power, and the workloads may be distributed to more than one computer or virtual machines. Additionally, processing of such large data sets, e.g., big data, may be performed in cloud processing systems. Cloud processing systems may be provisioned with high processing power virtual machines, which can share the processing load to reduce processing delays. Once the models are constructed and saved to the model database, the models can be used in real-time by the plasma reactor. The processing and use of the model may be via the controller of the plasma reactor or via one or more other networked computers (local or in the cloud).

Figure 3:
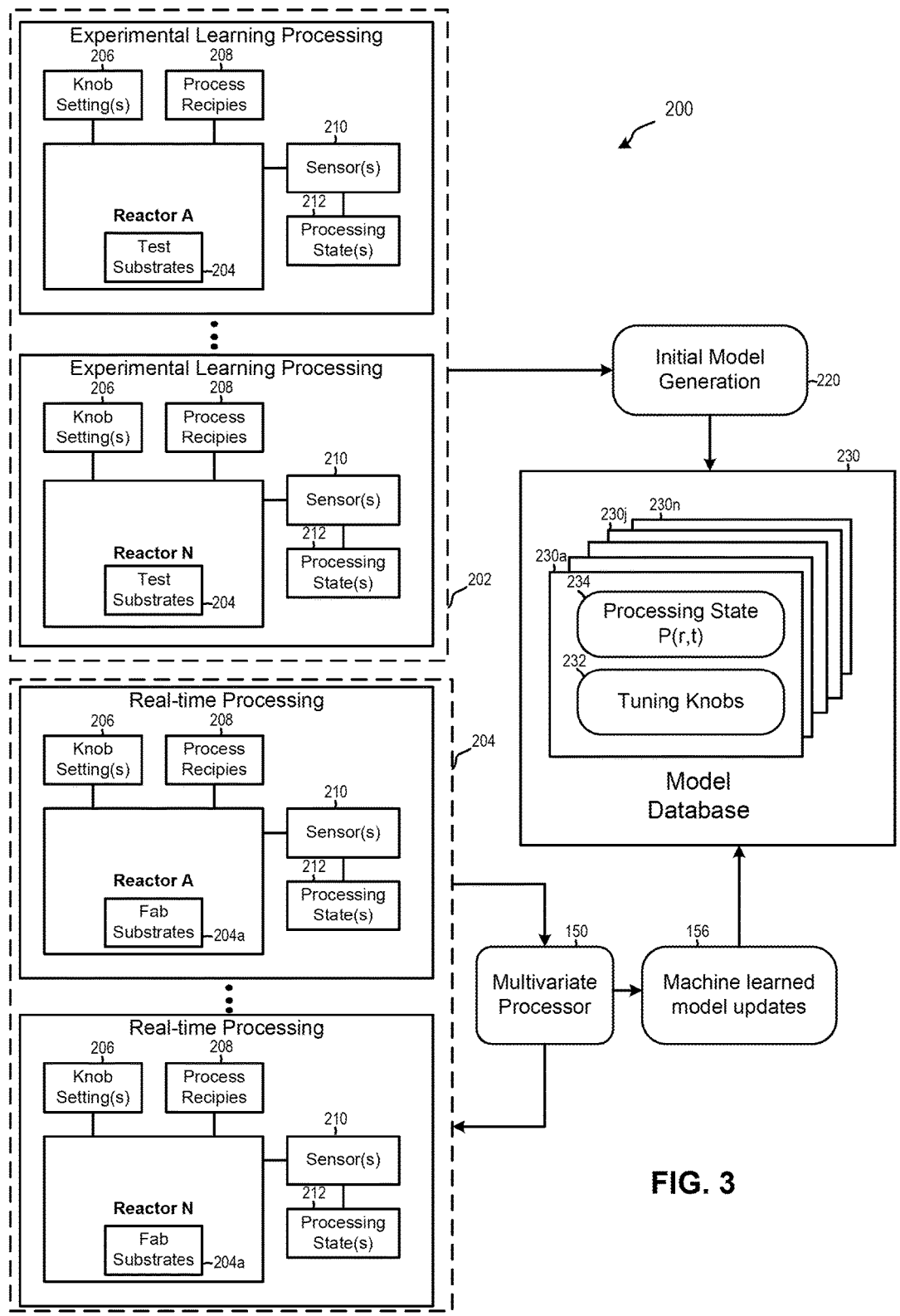
FIG. 3 illustrates an example of generating and updating models used for initiating the processing of substrates in reactors, in accordance with one embodiment.

FIG. 3 illustrates an example of generating and updating models 200 used for initiating the processing of substrates in reactors, in accordance with one embodiment. As shown, when a reactor is new or the reactor has not been previously characterized, the reactor can be characterized to define a model through a plurality of experimental learning processes 202. In these processes, test substrates 204 can be processed by the reactor. The processing of the test substrates 204 occur based on a plurality of knob settings 206 and these experiments can be processed for a plurality of different process recipes 208. Sensors 210 can be used to monitor the reactor during the learning processing, so as to define and generate processing states 212.

This information can then be used to generate an initial model 220, which can be added to a model database 230. As shown, the model database will include a plurality of models 230a-230n, and each model 230 will characterize processing state $\vec{P}(r,t)$ values, representing the desired processing state values 234 and the corresponding tuning knob 232 settings, which are anticipated to produce the desired processing state 234 for use in beginning processing of a substrate. As discussed above, when the processing first begins, a model is obtained from the model database in operation 154, which represents the beginning state for processing of a substrate. During the processing, any drift is accounted for by adjustments made to the compensation values to the tuning knobs 134, which further act to provide model updates 156 to the models.

This processing is shown in FIG. 3, where during real-time processing 204, fabrication or production substrates 204a are processed in reactors, and the resulting processing is continuously executed by the multivariate processor 150, which provides machine learned updates 156 to the models 230. Accordingly, as a model is continuously used in a specific reactor for a specific process, that model will be refined over time for that reactor, and updates to the model can be saved to the model database. Thus, when subsequent processing is done with the same reactor, the same model can be accessed, which can be specifically tuned and refined for that specific reactor and process. Accordingly, over time, the models in the model database 230 will be continually updated and refined by the changes to the model, per the updates made to the processing state by the machine learning.

Figure 4:
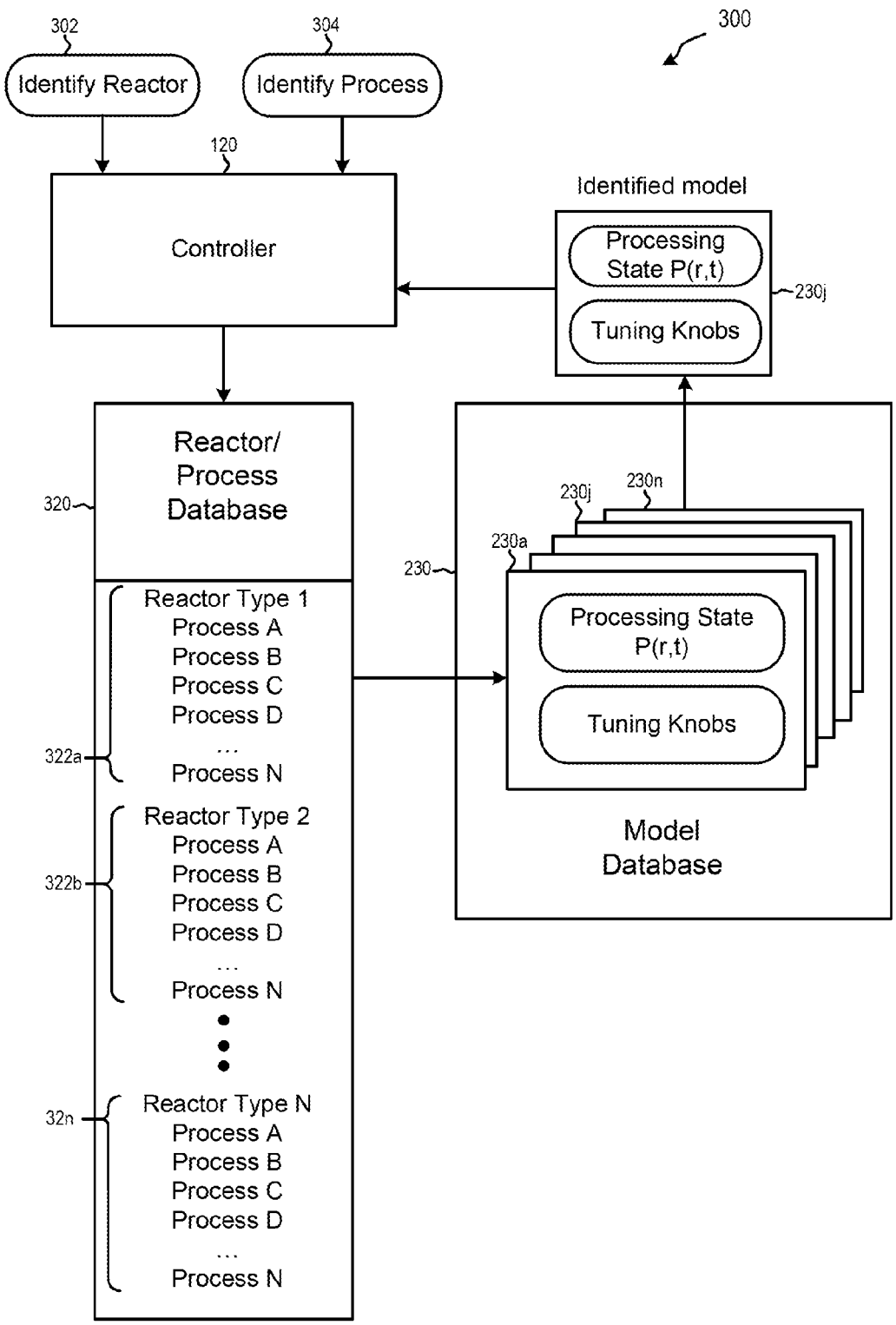
FIG. 4 illustrates a diagram of a system where the controller is used to identify an initial model for processing a substrate, in accordance with one embodiment.

FIG. 4 illustrates a diagram 300 of a system where the controller 120 is used to identify an initial model for processing a substrate, in accordance with one embodiment. In this example, the controller 120 will identify a reactor 302, and also identify a process 304. This information is used by the controller 120 to identify the reactor and process from a database 320, which includes information related to multiple types of reactors and processes associated with each type of reactor 322a-322n. Once the reactor and the process have been identified, the model database 230 can be accessed to identify a specific model, which in this example is model 230j. Model 230j includes the desired processing state P(r,t) and tuning knobs for achieving the desired processing state. As mentioned above, the desired processing state is the initial processing state that the multivariate processing will try to match based on the data streams received from the reactor 100, and based on verification and/or confirmation with etch rate or monitor wafers, adjustments to the desired processing state can be made so that the machine learning engine 180 can identify compensation vector(s) that will achieve the currently desired processing state.

The compensation vector, as noted above, will be transformed into actual compensation values 198 that can be applied to the tuning knobs 134, based on the ballot definition 197. In alternative embodiments, instead of requiring the controller 120 to identify the initial model 230j, a technician or engineer setting up a process can identify the model and provide it as input as a starting point. As mentioned above, the models can be used as an initial point in order to season a chamber after coming out of a wet process, and then enabling the determination that the chamber is ready for operation without unnecessarily proceeding with seasoning operations. In one embodiment, if it is determined that the chamber can be adjusted within a certain bound of setting adjustments to the tuning knobs, the compensation vector can be applied to generate changes to the tuning knobs that are applied to the plasma reactor, in order to make it ready for processing production wafers.

Once production wafer fabrication is ready for the reactor, the processing state used to achieve or ready the processing chamber can be used, along with the associated tuning knob settings. In this manner, when the production wafer is initially introduced into the reactor, it is believed that the reactor will be ready to process that production wafer and achieve substantially the same processing state as desired. If the processing state drifts, as the wafer or wafers are processed in the reactor, the multivariate processing 150 can apply compensation vector values so that the tuning knobs 134 can adjust the processing and achieve the desired processing state.

Figure 5:
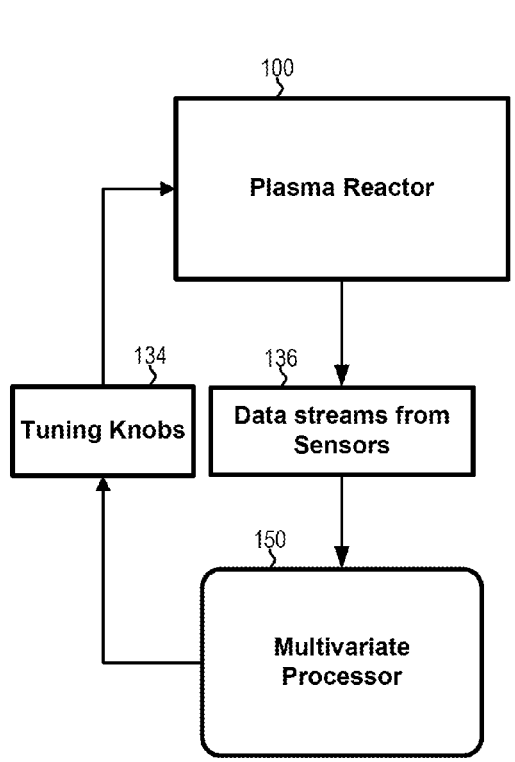
FIG. 5 illustrates a general example of using multivariate processor in order to make adjustments to tuning knobs.

FIG. 5 illustrates a general example of using multivariate processor 150 in order to make adjustments to tuning knobs 134. The process generally includes a feedback system that allows for reading of data streams 136 from sensors of the plasma reactor 100, processing the data streams from the sensors 136 in a multivariate processor 150 that includes machine learning, and then apply changes to settings of the tuning knobs 134, which are applied to the plasma reactor 100. This feedback loop ensures that changes made to the plasma reactor are tracked to the actual data streams being sensed by the sensors associated with the plasma reactor. That is, changes made to the tuning knobs 134 are made to correspond to the characteristics of the plasma measured within the processing space of the plasma reactor 100. In this manner, it is possible to make adjustments to the tuning knobs 134 to maintain or achieve a processing state within the plasma reactor 100 that is desired for the specific reactor and the specific process being implemented.

Figure 6:
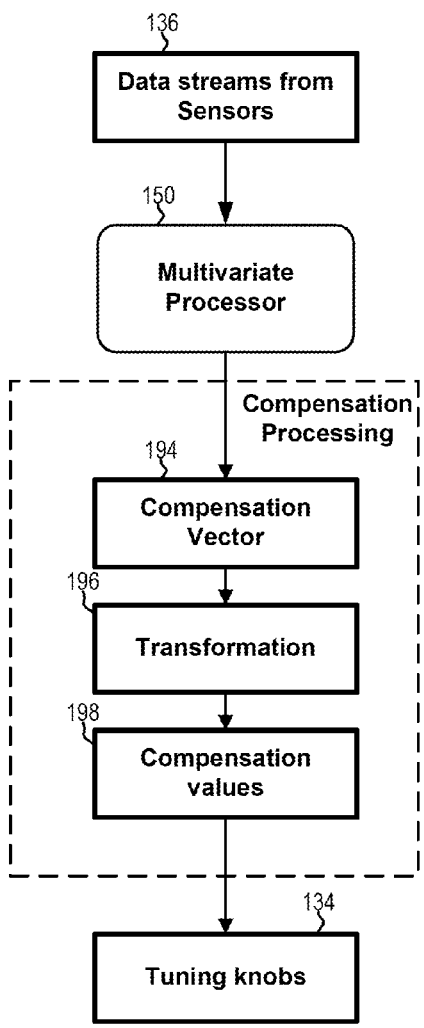
FIG. 6 illustrates an example flow where data streams from sensors are provided to the multivariate processor.

FIG. 6 illustrates an example flow where data streams 136 from sensors are provided to the multivariate processor 150. Once the multivariate processor 150 has identified the necessary changes required to bring the plasma reactor back to the state that is consistent with the desire processing state, the multivariate processor 150 will produce a compensation vector 194. Compensation processing 190 therefore includes receiving the compensation vector 194 from the multivariate processor 150. The compensation vector 194 is represented by metrics that are descriptive of measurement values obtained from the sensors of the plasma reactor 100.

Therefore, these metrics are not directly relatable to actual changes needed to be made to the tuning knobs 134. In one embodiment, a transformation function 196 is performed in order to convert the data in the compensation vector 194 into compensation values 198. This transformation can be performed using a lookup table of conversion information which is mapped to correspond to compensation vector data to compensation values that identify a specific tuning knob and a magnitude for adjusting a setting of the tuning knob.

By way of example, it is possible that the transformation function 196 can identify that only a certain number of tuning knobs need to be adjusted, such as more important or higher relevant tuning knobs. Tuning knobs that will not affect or cause much change to the processing state may not be adjusted at all. Therefore, in addition to simply translating the compensation vector values 194 into compensation values 198, the transformation function can eliminate certain knobs from being adjusted. Once the compensation values 198 have been identified, these values are transferred to the tuning knobs 134 of the reactor 100. The tuning knobs of the reactor can include settings, valves, controller instructions, changes, inputs, and the like. Any number of these tuning knob settings can be commanded or instructed by the controller 120 or can be set by an operator or set by manual operation.

Figure 7A:
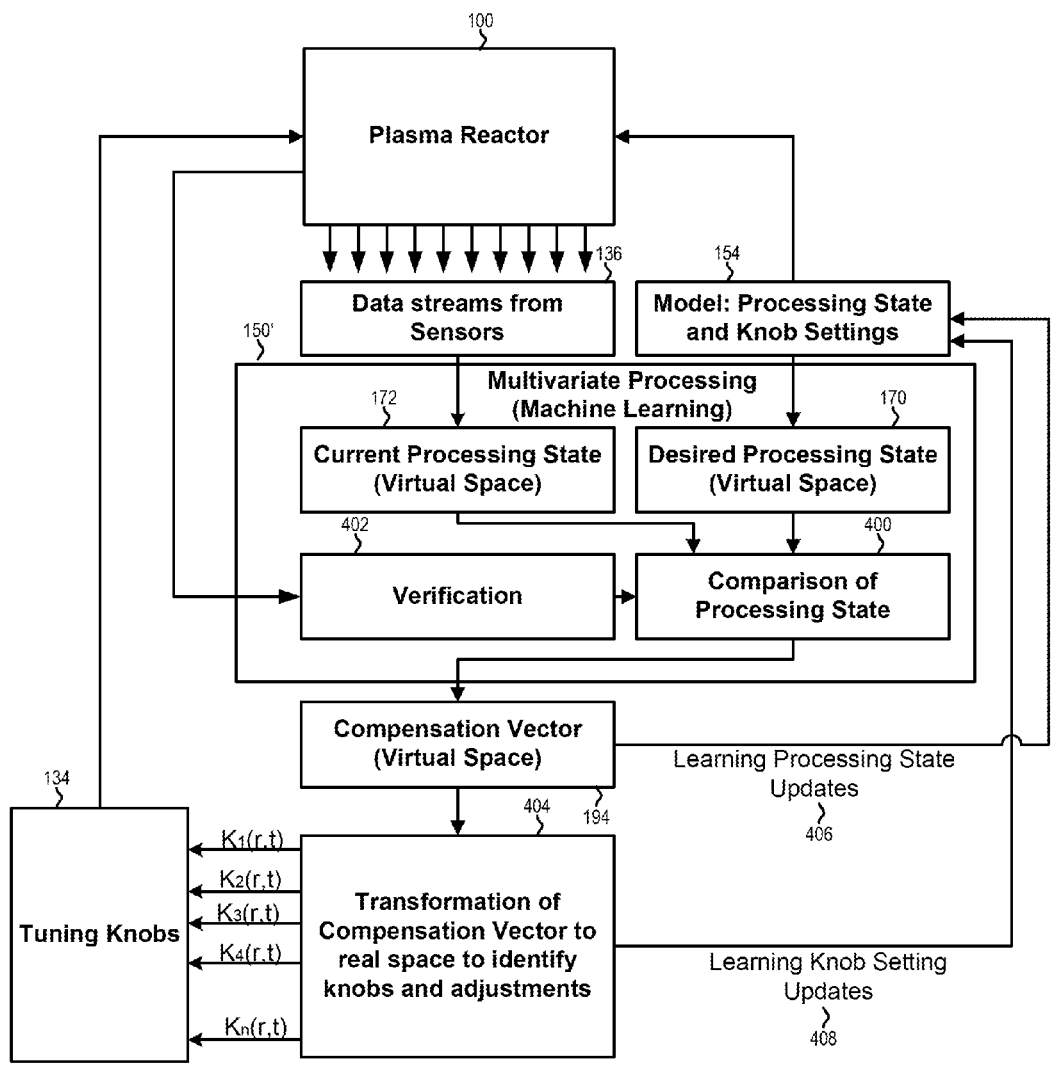
FIG. 7A illustrates a flow diagram used to represent dataflow associated with operating the multivariate processing, in accordance with one embodiment.

FIG. 7A illustrates a flow diagram used to represent dataflow associated with operating the multivariate processing 150', in accordance with one embodiment. In this example, the plasma reactor 100 is shown providing multiple outputs from different sensors. The different sensors will therefore produce data streams 136 during processing. To initiate processing, a model is selected in operation 154, which includes the processing state and the knob settings. As mentioned above, the model including the processing state and knob settings can be obtained from a model database, which may be accessible by a controller of the plasma reactor or a connected or networked computer. The model will include the desired processing state 170, which is defined in the virtual space.

Again, as mentioned above, the virtual space represents data that is descriptive of or representative of sensor output found in the data streams 136. The current processing state 172 is derived from, at least data obtained from the data streams 136 from the sensors. As mentioned above, the current processing state can also include information process from reactor wall surface dynamics 182, and optionally the phenomenological model 184. For simplicity in describing the processing flow, the multivariate processing using machine learning will identify differences between the current processing state 172 and the desired processing state 170, by way of an operation of comparing of processing state 400.

Verification operation 402 can also be used by the multivariate processing 150', in order to determine whether the actual processing by the plasma reactor 100 is in sync with the desired processing state 170. The verification 402 will therefore allow for adjustments to the comparison of processing state 400, so that any adjustments take into consideration the verification 402. The output of the multivariate processing 150'will therefore generate compensation vector 194 in the virtual space. The resulting compensation vector 194 will be used as an update 406 to the model 154, which acts as a learning process, which updates the desired processing state based on actual dynamics occurring within the processing volume and the data streams being sensed and produced by the sensors. In this example, the compensation vectors and 84, which are in the virtual space, are transformed in operation 404, where the compensation vectors are converted to the real space to identify which knobs to adjust and the amount of adjustment.

The resulting compensation values $K_1(r,t)$-$K_n(r,t)$ will therefore be applied to the tuning knobs 134, which are applied to the plasma reactor 100. As mentioned above, the application of the changes to the tuning knobs can be applied in various forms, depending on the specific changes to the settings of the tuning knobs. Some knobs are represented as valves, some as digital input, some as frequencies, some as power levels, some as gas flow, some as electrode positioning spacing, some as capacitor settings in matching networks, some in temperature settings, some in electrostatic chuck temperature, some in vacuum pressure, some in pumping rate, some in processing time, some in mixing ratios, and many more settings which are custom to the specific recipe and/or reactor setup. It should be understood that these example settings controlled by the tuning knobs are simply examples, and many more can exist. Furthermore, reference to tuning knobs should not only be viewed as actual physical knobs, but simply as an identifier for a specific type of setting for a specific type of control, input, or variable. Of course, in some embodiments, the tuning knob may actually be a knob.

Figure 7B:
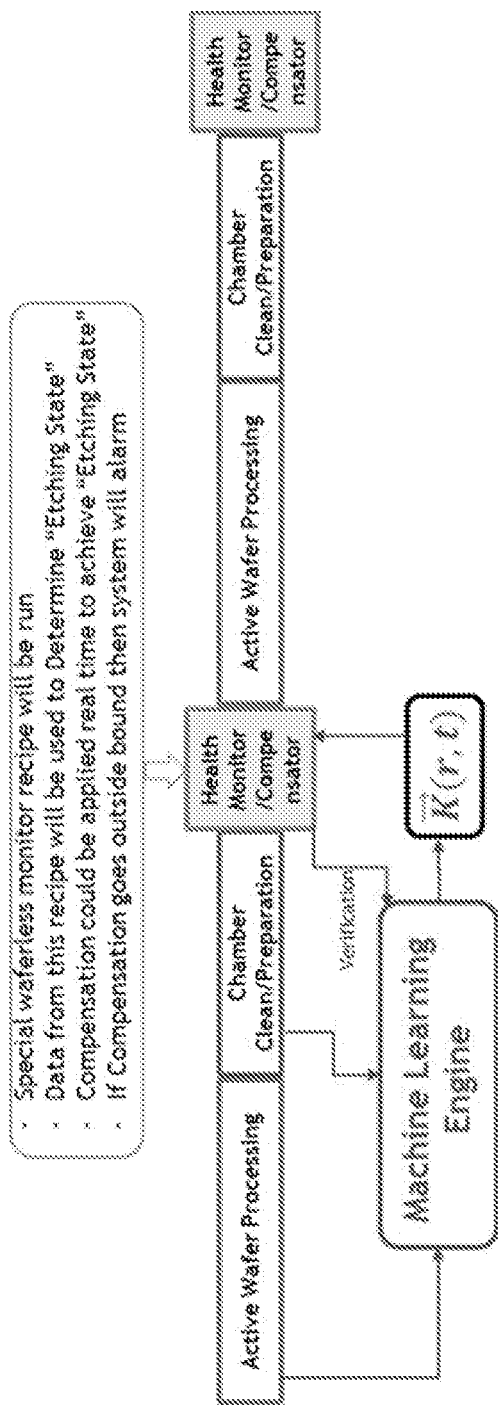
FIG. 7B illustrates an example implementation of machine learning to maintain processing state, in accordance with one embodiment.

FIG. 7B illustrates an example implementation of machine learning to maintain processing state, in accordance with one embodiment. In this example, machine learning engine can be used in real time. In order to keep the processing within bound and avoid the risk of implementing setting changes that are not needed or excessive at any one point, an implementation uses a check of the reactor processing state just before processing a wafer, as shown in FIG. 7B. In this manner, active wafer processing can occur, followed by chamber cleaning/preparation operations (e.g., which include reactor seasoning). A heath monitoring operation can be performed, just prior to entering active wafer processing, as a safety check. As can be appreciated, this strategy will ensure that chamber is in right state before taking the wafer in and reduces risk of misprocessed wafers.

Figure 8:
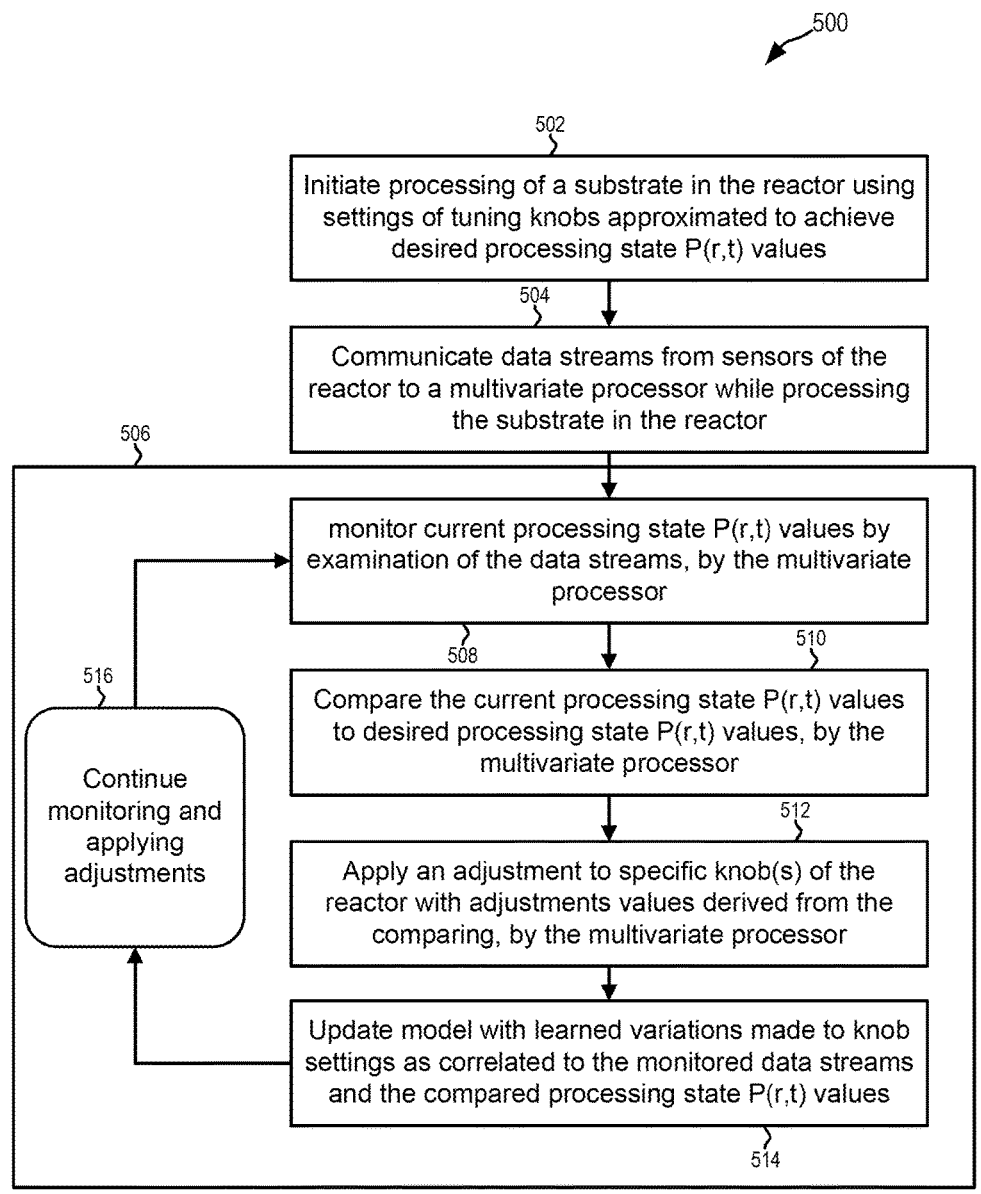
FIG. 8 illustrates an example process operation, in accordance with one embodiment.

FIG. 8 illustrates an example process operation 500, in accordance with one embodiment. In this example, processing of a substrate in a reactor using settings of tuning knobs approximated to achieve desired processing state values is defined in operation 502. In one embodiment, processing state adjustment can be performed during production processing of substrates. In another embodiment, processing state adjustment can be performed during chamber seasoning, following a wet clean. In this example, it is possible that the processing has been initiated after the wet clean operation process has been performed, and the chamber has been seasoned and made ready for processing of production substrates.

During processing, data streams from the sensors are communicated from the reactor to a multivariate processor in operation 504. Operation 506 shows the active monitoring and adjustment to tuning knobs, so as to achieve a desired processing state within the reactor. In operation 508, current processing state values are monitored by examination of the data streams, by the multivariate processor. As mentioned above, the multivariate processor can have other inputs, which are useful to the machine learning in order to more accurately identify values for the compensation vector.

In operation 510, the current processing state values are compared to a desired processing state values, by the multivariate processor. This comparison is preferably performed continuously during operation in real time. In another embodiment, this comparison can be performed periodically, or upon instruction by a computer program or by a user via manual input. In operation 512, and adjustment to specific knob(s) of the reactor are applied with adjustment values derived from the comparing operation performed by the multivariate processor. Operation 514 updates the model with learned variations made to knob settings as correlated to the monitor data streams and the compared processing state values. In this manner, models are continuously updated based on learned information by the machine learning of the multivariate processor for the specific reactor and specific recipe.

In operation 516, it is determined if the process should continue monitoring and applying adjustments. During the processing of one or more substrates, the process can continue with the monitoring, which can continue to update the model with adjustments made in order to keep the processing state consistent with the desired processing state. This continuous monitoring and applying of settings to the knobs assist in controlling process drift that may be occurring as more and more wafers are processed in the reactor. As mentioned above, as more wafers are processed in the reactor, more particulate buildup or part wear will occur inside the processing volume. The very nature of these physical changes will cause drift in the resulting processing of the wafer. However, because the processing state is being monitored, these changes will be exhibited in the detected processing state as gathered from the sensors.

Because these drift occurrences are being detected, the machine learning associated with the multivariate processor can make adjustments to the knobs of the reactor, so as to maintain the processing by the reactor in a state that achieves the desired processing state. As mentioned above, in addition to making these real-time changes to the processing state by way of the changes to the control knobs, various verification steps can be performed after processing of any number of wafers. This verification can be fed back, so as to adjust any adjustments made to the knobs, and avoid changes when the desired processing state is no longer achieving the desired result. Advantageously, the desired processing state is updated using feedback from the verification and/or monitoring, so that the adjustment by the machine learning can continue to apply adjustments to the control knobs in a manner that is consistent with the actual achievable results and performance of the reactor.

Furthermore, it should be appreciated that by correcting for drift, it is possible to achieve a high level of performance by the reactor for specific process recipes, and also achieve higher levels of wafer processing throughput from the reactor, before requiring the reactor to be brought down for cleaning. Additionally, if the monitoring is performed during seasoning steps following a wet clean, is also possible to start production wafers sooner, instead of wasting time continuing with seasoning operations that are not actually needed and are actually reducing production time that could be used for production wafers.

Figure 9:
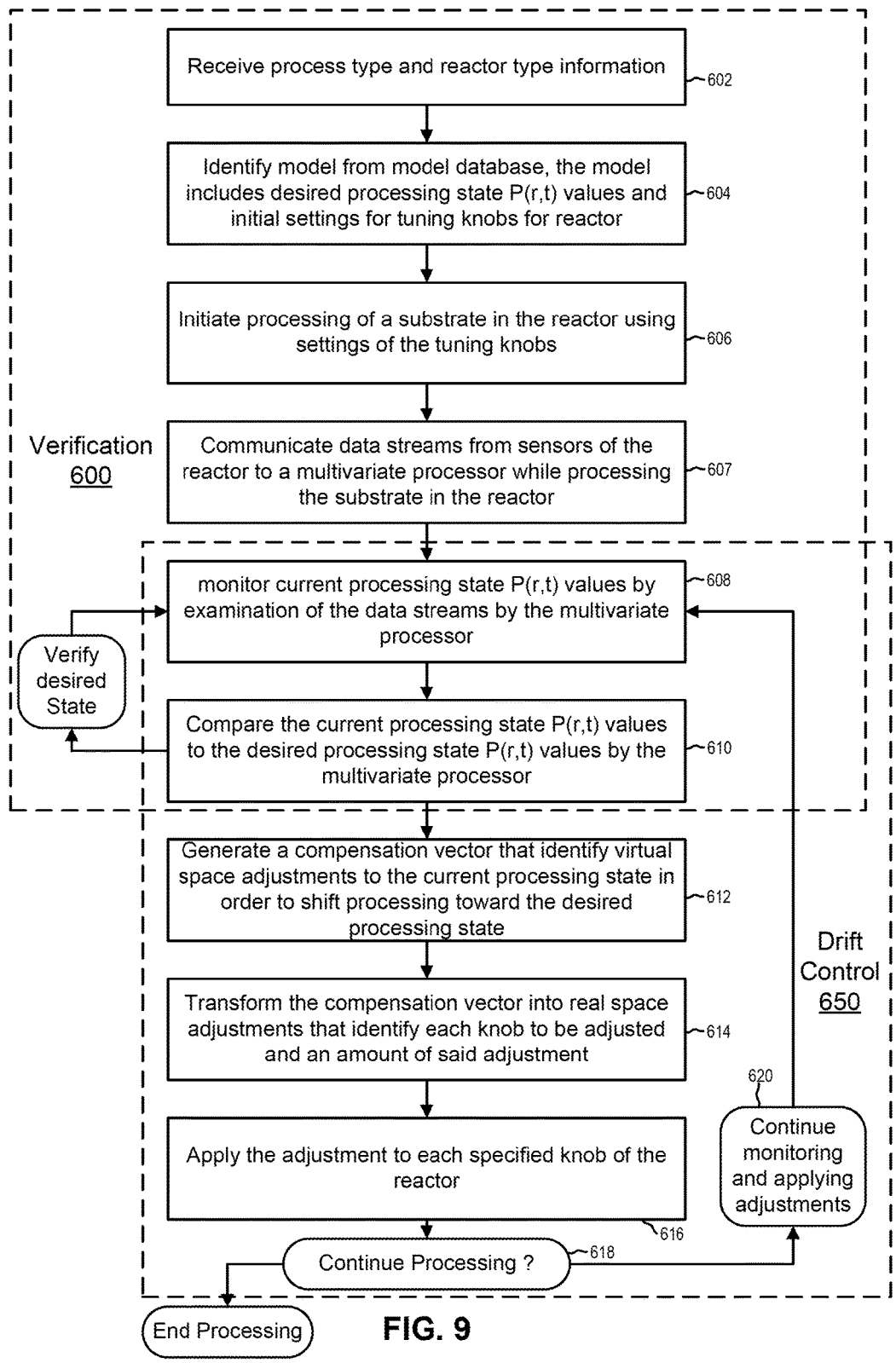
FIG. 9 illustrates an example of method operations that can be performed for verification operations and drift control operations, in accordance with one embodiment.

FIG. 9 illustrates an example of method operations that can be performed for verification 600 operations and drift control operations 650, in accordance with one embodiment. The verification operations 600 can be performed in order to determine whether a reactor has reached a state where it is ready to process production wafers. By way of example, this processing can be performed on a reactor during chamber seasoning operations. Drift control 650 can be performed, for example, after the reactor has entered processing of production wafers, and changes to the tuning knobs are required to correct for drift occurring due to use of the reactor.

In operation 602, information regarding the process type and the reactor type is received. This information is used to identify a model from the model database in operation 604. The model database may include a plurality of models that can be used for specific processes for a given reactor, and may include various reactors with their own specific processes that have been modeled. An example of a database including different types of reactors and processes that have been modeled for those reactors is shown in database 320 of FIG. 4. In another embodiment, the model may be obtained from a file, or may be input by a technician or engineer to the controller or a computer connected to the reactor.

In operation 606, processing of a substrate is initiated in the reactor using the settings of the tuning knobs, as identified in the model. As shown in FIG. 3, model 230*j* is associated with a desired processing state 234 and tuning knob settings 232. Thus, the tuning knob settings used in operation 606 will be obtained from a model initially, e.g., such as when a reactor is first used after a wet clean operation, and needs to be seasoned. In operation 607, during the processing of the substrate, data streams from the sensors are communicated to a multivariate processor while processing the substrate in the reactor. As mentioned above, the multivariate processor will include a machine learning engine, which is utilized to identify and learn the types of modifications required to the tuning knobs in order to place the processing back in accordance with the desired processing state values. In operation 608, the current processing state values are monitored by examination of the data streams by the multivariate processor.

In operation 610, the current processing state values are compared to the desired processing state values by the multivariate processor. If the current processing state is now in accordance with the desired processing state, the processing state is verified in operation 611. By way of example, at this point it can be said that the seasoning operation is complete, since the current processing state matches the desired processing state. In another embodiment, before the current processing state matches the desired processing state, the multivariate processor can identify a compensation vector that identifies or is used to identify adjustments that can be made to the tuning knobs in order to bring the reactor into a state that matches the desired processing state.

This operation can be performed to expedite placing a reactor that is undergoing seasoning quickly into a production state. As mentioned above, this is advantageous because it is no longer required that reactors be seasoned for arbitrarily long periods of time, as it is now possible to identify when the reactor has actually reached the desired processing state or is adjusted via the tuning knobs to reach the processing state quicker.

If the processing is being performed on a substrate during production wafer processes, the operation can continue to 612, were a compensation vector is generated to identify adjustments to be made to the current processing state in order to shift processing toward the desired processing state. In operation 614, the compensation vector is transformed into real space adjustments that identify each knob to be adjusted and an amount of said adjustment. In operation 616, the adjustment is applied to each specified knob of the reactor.

If processing is to continue in operation 618, the monitoring and applying of adjustments 620 can continue in order to prevent drift to occur as additional processing of wafers continue in the reactor. As mentioned above, it is anticipated that process drift will occur as the reactor continues to be used to process wafers, as the reactor walls will build up material and consumable parts may be used up over time. However, by making the adjustments using the multivariate processor that uses machine learning, it is possible to make adjustments to the tuning knobs in order to maintain the current processing state within substantial balance of the desired processing state.

Figure 10:
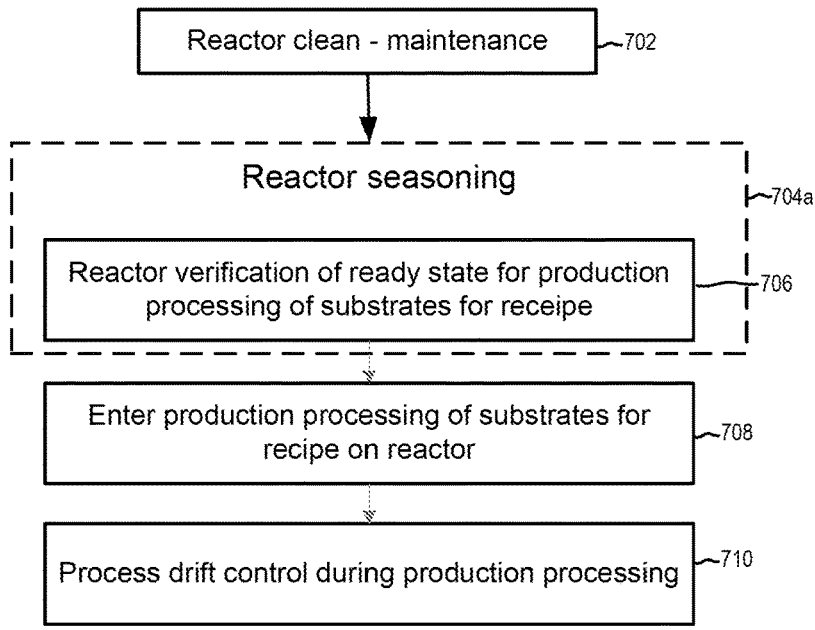
FIG. 10 illustrates an example of an operation of bringing a reactor up after reactor seasoning operation, in accordance with one embodiment.

FIG. 10 illustrates an example of an operation of bringing a reactor up after reactor seasoning operation 704*a*, in accordance with one embodiment. In operation 702, the reactor is cleaned and/or maintenance is performed on the reactor. During this operation, the reactor may be opened, parts replaced, parts cleaned, parts reconditioned, and/or simply assembled for operation. As mentioned, reactor seasoning 704*a* includes reactor verification of steady-state for production processing of substrates for a recipe in operation 706. This processing will be performed to monitor the processing state of the reactor during the reactor seasoning operations. As mentioned above, the seasoning operations may include running the reactor using a plurality of substrates that are designed to season the chamber, and the substrates processed will be chosen to resemble or mimic the type of processing to be performed by the production substrates using the desired or targeted process.

In one embodiment, the reactor verification of steady-state is achieved when the multivariate processing determines that the current processing state has matched or substantially matches the desired processing state, as per the processing performed by the machine learning engine 180, as described with reference to FIG. 2. Once the chamber is determined to have been seasoned, and is ready for production processing, the method moves to operation 708 where production processing of substrates can begin for a recipe in the reactor.

During the processing of one or more wafers in the reactor, drift control can be processed during production processing in operation 710. As mentioned above, drift control includes utilizing the multivariate processor in order to identify when a current processing state is drifting away from the desired processing state, which may occur as more substrates are processed. In one embodiment, by continually updating the adjustment to the tuning knobs, it is possible to maintain the reactor current processing state in line with the desired processing state, to prolong the effective and useful operation of the reactor for more wafers.

Figure 11:
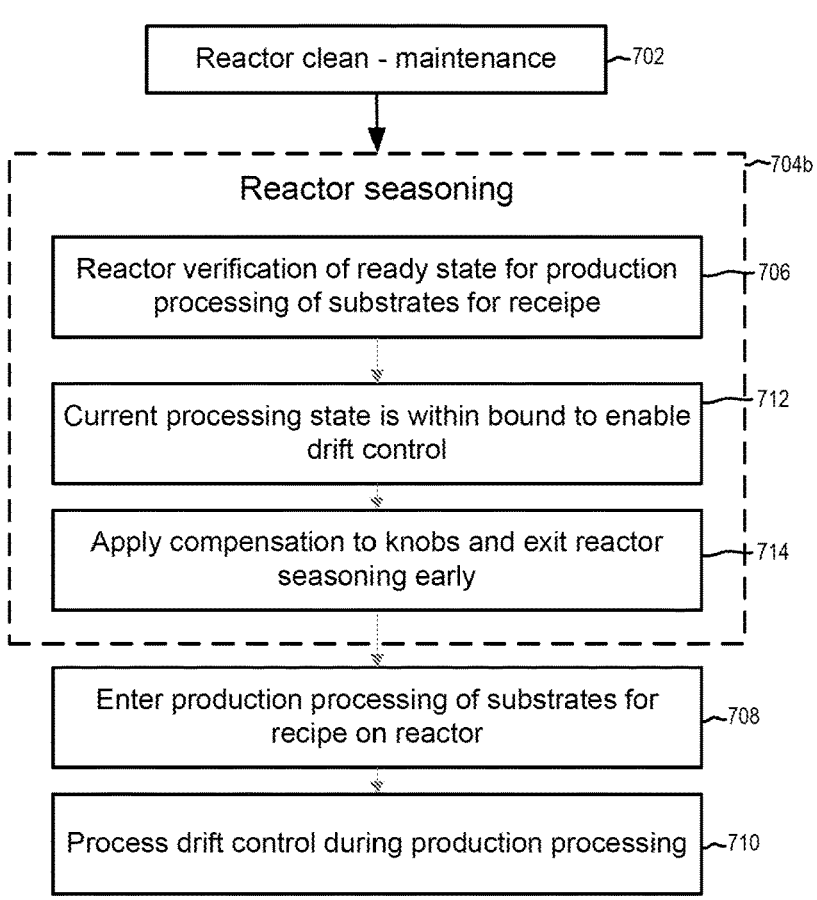
FIG. 11 illustrates another embodiment, where the reactor may be cleaned or maintained in operation.

FIG. 11 illustrates another embodiment, where the reactor may be cleaned or maintained in operation 702. In this example, reactor seasoning 704b includes additional operations to the process of reaching a steady-state by the reactor during seasoning. In this method, reactor verification of steady-state for production processing of substrates for recipe is begun in operation 706, as was done in FIG. 10. During the verification process, which includes running one or more seasoning wafers through the reactor, the method includes operation 712, where a determination is made whether the current processing state is within bound to enable drift control. Processing state is considered to be within bound when it is determined or predetermined that adjustments to the one or more tuning knobs can be performed, and that desired processing state can be reached.

In this example, drift control is used in the context of adjusting settings of the tuning knobs of the reactor during reactor seasoning, in order to place the reactor in a ready state for production processing without continuing to process seasoning wafers. In operation 714, if it is determined that the processing state is within bound, then compensation is applied to the tuning knobs of the reactor in order to exit the reactor seasoning early. By way of example, some seasoning operations may take several hours, in a neighborhood of 8 to 12 hours, and conventional techniques have erred on the side of caution and processed seasoning wafers for the longer period of seasoning, based on experience. However, operators that do this type of seasoning by experience, by virtue of their erring on the side of caution, will season a reactor for longer than it's needed.

In accordance with one embodiment, the processing 704b will enable identification of when the reactor can be adjusted by changing tuning knobs to bring the reactor state consistent with the desired processing state values, without continuing to process seasoning wafers. Thus, the reactor can be placed into actual production for processing production wafers sooner, and avoid the cost of seasoning and avoid the wasted cost of being unable to use the reactor for production processing to the fullest extent possible. In this embodiment, operation 708 and 710 are processed similar to that of FIG. 10.

Through the embodiments described herein, processing tools are being made intelligent enough to take decisions on how to maintain correct processing state of the reactor with minimum user input. Expanding this concept is very powerful in the semiconductor processing field, as this reduces the dependency of such tool's ability to maintain its condition from existing fabrication control systems and/or human operator experience. As noted human operator experience is also not a reliable method, as each operator/engineer will have his or her own methodology and once they move on, new personnel needs to be trained. The described embodiments are especially different conventional techniques, as the machine learning engine 180 of the multivariate processing uses actual real-time sensor data of tool to define its state. This is in contrast to many current techniques, which rely solely on monitor wafers and associated metrology tools. As noted above, embodiments of the present invention may use monitor wafers (and etch rate data), but its use is now for the purpose of verifying the learned compensation values identified by the multivariate processing in order to shift the process back to a real time desired processing state.

As mentioned, a unique feature of the disclosed embodiments is that the user's experience is not directly needed to perform chamber matching. These reactors are very complex and will usually have users of various experience levels. And, many users have limited understanding of reactor operations and may spend enumerable hours tuning to achieve a somewhat accurate processing state for the reactor. Using the described machine learning engine will ensure that tools are equipped with an advance level virtual user and systems can take correct decisions in a timely and real-time manner. This aspect is not only useful to tool manufactures that characterize processes for customers, but also for tool customers that need to provision their own processes on tools purchased from tool suppliers.

Through an extension of the various teachings described herein, the machine learning engine may also be applied for Rapid Process Development (RPD), which includes developing initial process trends and feeding that to the machine learning engine. The engine then tries to predict the desired state and can tune the process much faster. This will reduce process development time and will reduce dependence on user experience level.

In one embodiment, the controller 120, described with reference to FIG. 1 above may include a processor, memory, software logic, hardware logic and input and output subsystems from communicating with, monitoring and controlling a plasma processing system. The controller 120 may also handle processing of one or more recipes including multiple set points for various operating parameters (e.g., voltage, current, frequency, pressure, flow rate, power, temperature, etc.), e.g., for operating a plasma processing system. Furthermore, although more detailed examples were provide with reference to etching operations (e.g., etching tools), it should be understood that the operations can equally be utilized for deposition operations (e.g., deposition tools). For example, in the verification operations, instead of verifying etch performance, the verification can be of deposition performance. Deposition performance can be quantified in various ways, and without limitation, various types of metrology methods and/or tools may be used. Furthermore, deposition performance may be measured, sensed, approximated, and/or tested in-situ or off-line.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by a process that is engineered to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
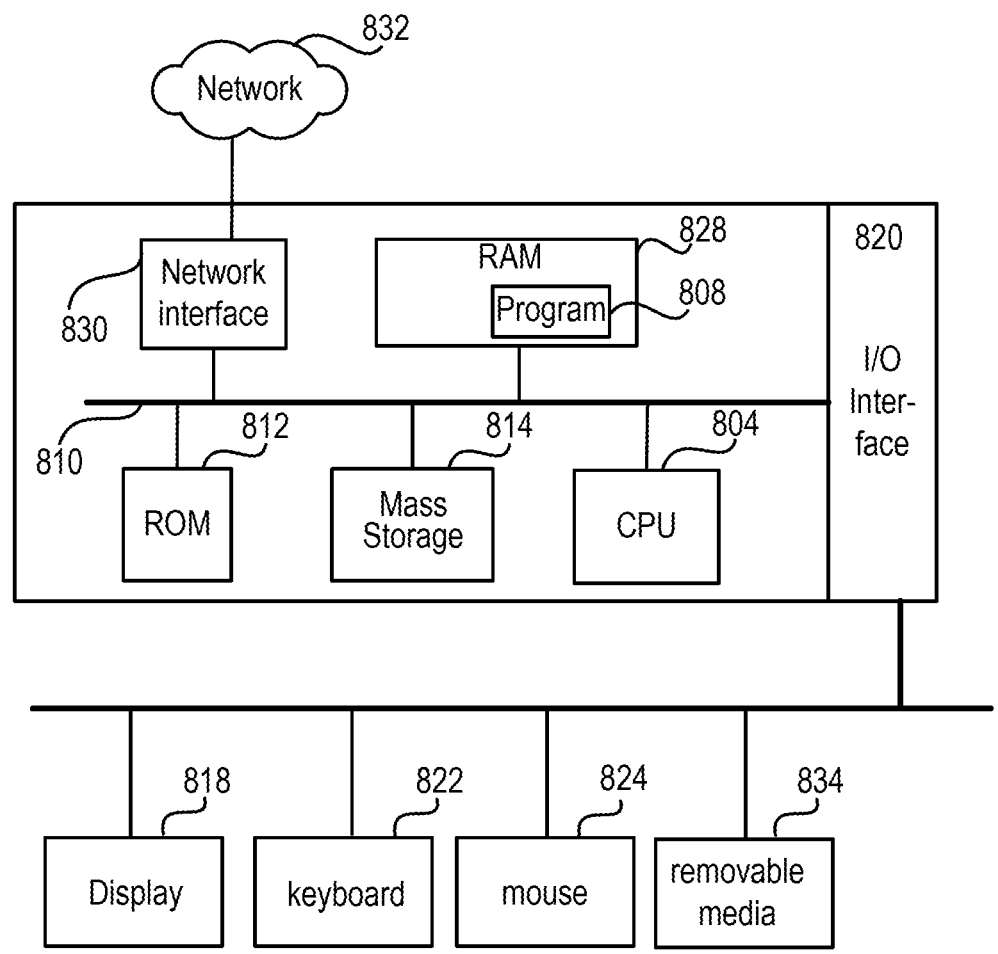
FIG. 12 is a simplified schematic diagram of a computer system for implementing embodiments.

FIG. 12 is a simplified schematic diagram of a computer system for implementing embodiments. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 828, read-only memory (ROM) 812, and mass storage device 814. System controller program 808 resides in random access memory (RAM) 828, but can also reside in mass storage 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 828, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

For more information regarding methods for inspecting process chambers and/or consumable parts, reference may be made to U.S. patent application Ser. No. 14/961,756, filed on Dec. 7, 2015 and entitled "Estimation of Lifetime Remaining for Consumable Part in a Semiconductor Manufacturing Chamber," which is incorporated by reference herein.

For more information on methods for monitoring process conditions and methods for adjusting settings, reference may be made to U.S. Provisional Patent Application No. 62/370,658, filed on Aug. 3, 2016, entitled "Methods and Systems for Monitoring Plasma Processing Systems and Advanced Process and Tool Control," U.S. Pat. No. 6,622,286, entitled "Integrated electronic hardware for wafer processing control and diagnostic," U.S. Pat. No. 8,295,966, entitled "Methods and apparatus to predict etch rate uniformity for qualification of a plasma chamber," U.S. Pat. No. 8,983,631, entitled "Arrangement for identifying uncontrolled events at the process module level and methods thereof," U.S. Pat. No. 8,473,089, entitled "Methods and apparatus for predictive preventive maintenance of processing chambers," U.S. Pat. No. 8,271,121, entitled "Methods and arrangements for in-situ process monitoring and control for plasma processing tools," and U.S. Pat. No. 8,538,572, entitled "Methods for constructing an optimal endpoint algorithm," all of which are assigned to Lam Research Corporation, the assignee of the present application and each of which are incorporated herein for all purposes.

For additional information regarding machine learning algorithms, phenomenological models and associated processes, reference may be made to a Theses entitled "*Virtual Metrology for Semiconductor Manufacturing Applications*," by Bertorelle Nicola, University of Padua, Department of Information Engineering, dated 28 Jun. 2010; a Theses entitled "*Statistical Methods for Semiconductor Manufacturing*," by Gian Antonio Susto, Universita Degli Studi di Padova, School in Information Engineering, January 2013; and a paper entitled "*Etching characteristics and mechanisms of the MgO thin films in the CF4/Ar inductively coupled plasma*," by A. Efremov, et al. Department of Electronic Devices and Materials Technology, Sate University of Chemistry and Technology, 7, F. Engels St., 15300 Ivanovo, Russia, Jan. 12, 2007, each of which is herein incorporated by reference.

Further, embodiments and any specific features described in the above incorporated by reference documents and applications may be combined with one or more features described herein, to define or enable specific embodiments.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for controlling processing state of a plasma reactor, comprising:
   initiate processing of a substrate in the plasma reactor using settings for tuning knobs of the plasma reactor that are approximated to achieve desired processing state values;
   receiving a plurality of data streams from the plasma reactor during the processing of the substrate, the plurality of data streams used to identify current processing state values;
   generating a compensation vector that identifies differences between the current processing state values and the desired processing state values;
   transforming the compensation vector into adjustments to the settings for the tuning knobs;
   applying the adjustment to the tuning knobs of the plasma reactor;
   accessing a model database for a type of the plasma reactor and a type of a process to be used for the processing of the substrate in the plasma reactor; and
   identifying a model from the model data, the model includes the settings for tuning knobs of the plasma reactor that are approximated to achieve desired processing state values.

2. The method of claim 1, wherein the plurality of data streams are received from sensors that are interfaced with the plasma reactor or interfaced with a controller that is in communication with the plasma reactor, wherein the sensors include one or more of an optical emission spectrometry (OES) sensor, interferometry, a pressure sensor, a voltage sensor, a current sensor, a temperature sensor, a flow rate sensor, frequency sensor, a power sensor, a metrology sensor, and combinations of two or more thereof.

3. The method of claim 1, wherein the tuning knobs relate to controls interfaced with the plasma reactor, the controls include one or more of controls to adjust gas flow meters, controls to adjust power settings, controls to adjust temperature settings, controls to adjust physical gap separations between top and bottom electrodes of the plasma reactor, controls for adjusting an electrostatic chuck (ESC) temperature or operation, controls for adjusting bias power settings, controls for setting chamber pressures, controls for setting frequencies of one or more radio frequency generators, controls for setting run time of specific recipe operations, controls for setting pumping rates of vacuum, controls for setting duration of gas flows, controls for setting monitoring algorithms, controls triggering borescope inspections, controls for setting or determining intervals between clean operations, or combinations of two or more thereof.

4. The method of claim 1, wherein the desired processing state and the current processing state are defined in a virtual space that is descriptive of a physical state of plasma conditions sensed within a processing volume of the plasma reactor, the plasma conditions include a set of ion, electron and neutral fluxes at a plane of the substrate for a specific reactor wall surface condition.

5. The method of claim 4, wherein the compensation vector identifies the differences between the current processing state values and the desired processing state values in the virtual space, and the transformation of the compensation vector identifies the adjustments to the settings for the knobs as a set of identified physical knobs having an identified physical adjustment, wherein a controller of the plasma reactor is configured to process program instructions that cause the adjustments of the settings to the knobs.

6. The method of claim 1, further comprising,
continuing to receive the plurality of data streams from the plasma reactor during the processing of the substrate to produce the adjustments to the settings of the tuning knobs to assist in moving the current processing state values toward the desired processing state values.

7. The method of claim 6, wherein a multivariate process is configured to identify the differences between the current processing state values and the desired processing state values, and further comprising,
processing machine learning to make adjustments to the desired processing state values to produce adjusted desired processing state values based, at least in part, on verification feedback received from one or both of etch rate performance or monitor wafer performance of the processing of the substrate.

8. The method of claim 7, wherein the machine learning uses as input sensitivity data for the sensors of the plasma reactor, such that the produced compensation vector includes adjustments that are moderated based on sensitivity data.

9. The method of claim 1, wherein the processing of the substrate is identified for a specific plasma reactor and a specific process recipe;
wherein each specific process recipe and each specific plasma reactor has an associated model that includes settings for tuning knobs and desired processing state values, the model is accessed from a model database.

10. The method of claim 9, wherein as a model from the model database is used, a machine learning process makes adjustments to the settings for the tuning knobs of the model to improve settings to the specific plasma reactor to achieve the desired processing state values.

11. The method of claim 10, further comprising,
updating the models in the model databased based on the adjustments made by the machine learning process.

12. A method for controlling processing state of a plasma reactor, comprising:
initiate processing of a seasoning substrate in the plasma reactor using settings for tuning knobs of the plasma reactor that are approximated to achieve desired processing state values;
receiving a plurality of data streams from the plasma reactor during the processing of the seasoning substrate, the plurality of data streams used to identify current processing state values;
continuing to process the seasoning substrate or additional seasoning substrates in the plasma reactor until the current processing state values are within a predefined threshold of the desired processing state values;
generating a compensation vector that identifies differences between the current processing state values and the desired processing state values;
transforming the compensation vector into adjustments to the settings for the tuning knobs;
applying the adjustment to the tuning knobs of the plasma reactor;
identifying the plasma reactor as ready for processing of production substrates when the adjustment to the tuning knobs have placed the plasma reactor in a state that substantially produces the desired processing state values;
initiate processing of a production substrate in the plasma reactor using settings for tuning knobs of the plasma reactor as set during the seasoning of the substrate that are approximated to achieve desired processing state values;
receiving a plurality of data streams from the plasma reactor during the processing of the production substrate, the plurality of data streams used to identify current processing state values;
generating a compensation vector that identifies differences between the current processing state values and the desired processing state values;
transforming the compensation vector into adjustments to the settings for the tuning knobs; and
applying the adjustment to the tuning knobs of the plasma reactor to compensate for drift in processing by the plasma reactor over time.

13. The method of claim 12, wherein the desired processing state and the current processing state are defined in a virtual space that is descriptive of a physical state of plasma conditions sensed within a processing volume of the plasma reactor, the plasma conditions include a set of ion, electron and neutral fluxes at a plane of the substrate for a detected reactor wall surface condition.

14. The method of claim 13, wherein the compensation vector identifies the differences between the current processing state values and the desired processing state values in the virtual space, and the transformation of the compensation vector identifies the adjustments to the settings for the knobs as a set of identified physical knobs having an identified physical adjustment, wherein a controller of the plasma reactor is configured to process program instructions that cause the adjustments of the settings to the knobs.

* * * * *